US 6,696,219 B2

(12) United States Patent
Yasunami et al.

(10) Patent No.: US 6,696,219 B2
(45) Date of Patent: Feb. 24, 2004

(54) POSITIVE RESIST LAMINATE

(75) Inventors: Shoichiro Yasunami, Shizuoka (JP); Kenichiro Sato, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/880,030

(22) Filed: Jun. 14, 2001

(65) Prior Publication Data

US 2002/0028409 A1 Mar. 7, 2002

(30) Foreign Application Priority Data

Jun. 14, 2000 (JP) ..................... P. 2000-178538

(51) Int. Cl.$^7$ ................................................ G03F 7/11
(52) U.S. Cl. ................................................ 430/271.1
(58) Field of Search ....................... 430/271.1

(56) References Cited

U.S. PATENT DOCUMENTS

| 5,556,734 | A  | * | 9/1996  | Yamachika et al. | ...... | 430/270.1 |
| 5,856,071 | A  |   | 1/1999  | Kotachi et al.   | ...... | 420/326   |
| 6,165,682 | A  | * | 12/2000 | Foster et al.    | ...... | 430/271.1 |
| 6,323,287 | B1 | * | 11/2001 | Foster et al.    | ...... | 525/328.8 |
| 6,444,408 | B1 | * | 9/2002  | Brock et al.     | ...... | 430/322   |
| 2002/0058204 | A1 | * | 5/2002 | Khojasteh et al. | ...... | 430/270.1 |
| 2002/0102483 | A1 | * | 8/2002 | Adams et al.     | ...... | 430/30    |

FOREIGN PATENT DOCUMENTS

| EP | 0 849 634 A1  | * | 6/1998  | ........... G03F/7/004 |
| EP | 0 967 522 A1  | * | 12/1999 | ........... G03F/7/039 |
| JP | 2-293850      |   | 12/1990 | ........... G03F/7/075 |
| JP | 08-62834-a    | * | 3/1996  | ........... G03F/7/004 |
| JP | 10-282678     |   | 10/1998 | ........... G03F/7/075 |
| JP | 2001125272    | * | 5/2001  | ........... G03F/7/075 |
| WO | 00/54105      |   | 9/2000  | ........... G03C/1/492 |

OTHER PUBLICATIONS

JP08–062834, online machine translation of this document by Japan Patent Office, abstract copyright 2000 and 1998 and translation printed Sep. 12, 2002, 13 pages.*
JP408062834A, English abstract of JP 08–62834, one page copyright 1996, from Japan Patent Office.*

* cited by examiner

Primary Examiner—Cynthia Hamilton
(74) Attorney, Agent, or Firm—Sughrue Mion, PLLC

(57) ABSTRACT

A positive resist laminate which comprises a substrate, a first resist layer and a second resist layer, wherein the first resist layer is to be a heat-hardening layer and comprises (a-1) a polymer containing an alicyclic skeleton in the side chain thereof, and the second resist layer comprises: (b) a polymer which contains a silicon atom in the side chain thereof and which is insoluble in water and becomes soluble in an aqueous alkali solution by the action of an acid; and (c) a compound which generates an acid upon irradiation with an actinic ray or radiation.

16 Claims, No Drawings

POSITIVE RESIST LAMINATE

FIELD OF THE INVENTION

The present invention relates to a positive resist laminate suitable for exposure to a radiant ray such as an ultraviolet ray, a far ultraviolet ray, an X-ray, an electron beam, a molecular beam, a γ-ray and a synchrotron radiation. More particularly, it relates to a positive resist laminate for use in the fine fabrication which is employed in a step for producing a circuit board in production of a semiconductor such as integrated circuit and which has particularly high resolution and sensitivity, provides a resist having rectangular cross-sectional form and possesses wide process allowance.

The positive resist laminate of the present invention can be used in the following manner. For instance, the positive resist laminate is formed on a substrate such as a semiconductor wafer, glass, ceramic and metal, or an anti-reflective layer or organic layer provided thereon by a spin coating method or a roller coating method in a thickness of from 0.01 to 3 μm. Then, it is heated, dried, printed a circuit pattern through an exposure mask by irradiation with an active ray and developed to form a positive image. Thereafter, etching is conducted using the positive image as a mask, thereby performing pattern fabrication on the substrate. Typical application field of the resist laminate of the present invention includes production of semiconductor such as integrated circuit, production of circuit board for liquid crystal or thermal head and other photofabrication processes.

BACKGROUND OF THE INVENTION

Keeping step with increased integration of LSI, resolution limit becomes clear in a monolayer resist hitherto known. Thus, there has been proposed a method for forming a high figure-ratio pattern which is fine and has a large thickness using a multilayer resist instead of the monolayer resist. Specifically, a thick organic polymer layer is formed as a first layer and a thin resist material layer is then formed thereon as a second layer. The resist material of the second layer is exposed to high energy radiation and developed. Using the pattern thus-formed as a mask the organic polymer of the first layer is anisotropically etched by oxygen plasma etching ($O_2$ RIE), thereby providing a pattern having a highly rectangular form (refer to Solid State Technology, vol. 24, page 73 (1981)).

In such a case, since the second resist layer must have high resistance to the $O_2$ RIE, a silicon-containing polymer is conventionally used. In particular, a polymer of vinyl polymerization type having a silicon atom in the side-chain thereof is widely investigated because of impartation of heat resistance and ease of synthesis, as described, for example, in JP-A-2-293850 (the term "JP-A" as used herein means an "unexamined published Japanese patent application"), JP-A-10-282678 and U.S. Pat. No. 5,856,071.

The first resist layer is ordinarily formed by a method of setting a novolak resin with heat temperature treatment in order to provide good adhesion to a substrate, a good film-forming property, high dry-etching resistance, immiscibility with the second resist layer, a large light-absorbing property in the exposure wavelength range and the like, and the method is widely employed. However, since adhesion of such a layer to the second resist layer comprising the silicon-containing polymer is poor, the method has a problem in that winding of line and further break of pattern tend to occur, particularly in fine line/space of 0.2 μm or less.

Further, it is necessary for the first resist layer containing the novolak resin to be subjected to the high temperature treatment for a long period of time. This causes a problem in that production aptitude is very low in the production of semiconductor device. If the high temperature treatment is conducted in a short time, setting of the first resist layer becomes insufficient to cause a phenomenon of mixing with the second resist layer (intermix) and as a result, a pattern having a large amount of development residue is formed.

SUMMARY OF THE INVENTION

Therefore, an object of the present invention is to provide a positive resist laminate having high resolution which is respondent to exposure in a far ultraviolet region.

Another object of the present invention is to provide a positive resist laminate which provides a resist pattern in which winding of line is restrained in fine line/space of 0.2 μm or less.

A further object of the present invention is to provide a positive resist laminate which depresses an amount of development residue (development defect) occurred in fine line/space of 0.2 μm or less.

A still further object of the present invention is to provide a positive resist laminate which has high production aptitude.

Other objects of the present invention will become apparent from the following description.

As a result of intensive investigations made by the inventors taking the above-described problems into consideration, it has been found that the objects of the present invention are accomplished by the following positive resist laminates:

(1) A positive resist laminate which comprises a substrate, a first resist layer and a second resist layer, in this order, wherein the first resist layer is to be hardened with heat and comprises (a-1) a polymer containing a repeating unit represented by formula (1) shown below and a repeating unit represented by formula (2) shown below, and the second resist layer comprises: (b) a polymer which contains a silicon atom in the side chain thereof and which is insoluble in water and becomes soluble in an aqueous alkali solution by the action of an acid; and (c) a compound which generates an acid upon irradiation with an actinic ray or radiation:

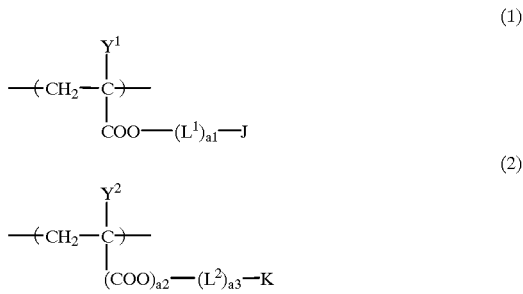

wherein $Y^1$ and $Y^2$ each independently represents a hydrogen atom, an alkyl group, a cyano group or a halogen atom; $L^1$ and $L^2$ each independently represents a divalent linkage group which may be substituted; J represents an alicyclic hydrocarbon group which may be substituted; a1 represents 0 or 1; K represents an aryl group which may be substituted; and a2 and a3, which are the same or different, each represents 0 or 1.

(2) The positive resist laminate as described in item (1), wherein the polymer (a-1) contains at least one group selected from a hydroxy group, a primary amino group and a secondary amino group, and the first resist layer further comprises: (a-2) a crosslinking agent which is activated by an acid to react with the polymer (a-1), thereby forming a crosslinking structure; and (a-3) a compound which generate an acid by heat.

(3) The positive resist laminate as described in item (1), wherein the polymer (b) is at least one of:

a polymer (b-1) contains: a repeating unit represented by formula (4) shown below; and at least one repeating unit selected from those represented by formulae (5a) and (5b) shown below; and a polymer (b-2) contains: a repeating unit represented by formula (4) shown below; at least one repeating unit selected from those represented by formulae (5a) and (5b) shown below; and a repeating unit represented by formula (6) shown below:

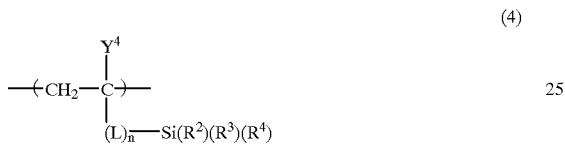

wherein $Y^4$ represents a hydrogen atom, an alkyl group, a cyano group or a halogen atom; $R^2$, $R^3$ and $R^4$, which are the same or different, each represents an alkyl group, a haloalkyl group, a halogen atom, an alkoxy group, a trialkylsilyl group or trialkylsilyloxy group; L represents an alkylene group which may be substituted; and n represents 0 or 1,

wherein $Y^5$ represents a hydrogen atom, an alkyl group, a cyano group or a halogen atom; $L^3$ represents a mere bond or a divalent linkage group; and Q represents a group which is decomposable by an acid to generate a carboxylic acid,

wherein $X^1$ and $X^2$, which are the same or different, each represents an oxygen atom, a sulfur atom, —NH— or —NHSO$_2$—; $L^{11}$ and $L^{12}$, which are the same or different, each represents a mere bond or a divalent linkage group; $A^1$ and $A^2$, which are the same or different, each represents a hydrogen atom, a cyano group, a hydroxy group, —COOH, —COOR$^5$, —CO—NH-R$^6$, an alkyl group which may be substituted, an alkoxy group which may be substituted or —COOQ; $R^5$ and $R^6$, which are the same or different, each represents an alkyl group which may be substituted; and Q represents a group which is decomposable by an acid to generate a carboxylic acid,

wherein Z represents an oxygen atom or N—R$^7$; $R^7$ represents a hydrogen atom, a hydroxy group, a straight-chain or branched alkyl group, a trihalomethyl group or —O—SO$_2$—R$^8$; and $R^8$ represents an alkyl group, a trihalomethyl group or camphor residue.

(4) The positive resist laminate as described in item (1), wherein the polymer (b) is at least one of:

a polymer (b-3) contains a repeating unit represented by formula (7) shown below; and a polymer (b-4) contains: a repeating unit represented by formula (7) shown below; and at least one repeating unit selected from those represented by formulae (5a) and (5b) described above:

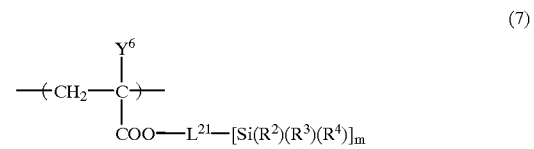

wherein $Y^6$ represents a hydrogen atom, an alkyl group, a cyano group or a halogen atom; $R^2$, $R^3$ and $R^4$, which are the same or different, each represents an alkyl group, a haloalkyl group, a halogen atom, an alkoxy group, a trialkylsilyl group or trialkylsilyloxy group; $L^{21}$ represents a linkage group having a valence of from 2 to 4; and m represents an integer of from 1 to 3.

(5) The positive resist laminate as described in item (1), wherein the second resist layer further comprises (d) a nitrogen-containing basic compound.

(6) The positive resist laminate as described in item (1), wherein the second resist layer further comprises (e) a surfactant containing at least one of fluorine atom and silicon atom.

(7) The positive resist laminate as described in item (1), wherein the alicyclic hydrocarbon group represented by J in the formula (I) is a bridged alicyclic hydrocarbon group having from 5 to 25 carbon atoms.

(8) The positive resist laminate as described in item (2), wherein the crosslinking agent (a-2) is a compound selected from a melamine compound, benzoguanamine compound, glycoluril compound and urea compound each substituted with at least one group selected from a methylol group, an alkoxymethyl group and an acyloxymethyl group.

(9) The positive resist laminate as described in item (2), wherein the compound (a-3) is a sulfonic acid ester compound.

(10) The positive resist laminate as described in item (2), wherein the compound (a-3) is a diaryliodonium salt compound.

(11) The positive resist laminate as described in item (1), wherein the compound (c) is an iodonium salt represented by formula (PAG3) shown below or a sulfonium salt represented by formula (PAG4) shown below:

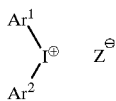
(PAG3)

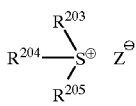
(PAG4)

wherein $Ar^1$ and $Ar^2$, which are the same or different, each represents a substituted or unsubstituted aryl group; $R^{203}$, $R^{204}$ and $R^{205}$, which are the same or different, each represents a substituted or unsubstituted alkyl group or a substituted or unsubstituted aryl group; and $Z^-$ represents a counter anion.

(12) The positive resist laminate as described in item (5), wherein the nitrogen-containing basic compound (d) is a nitrogen-containing cyclic compound having the structure represented by the following formula (VI):

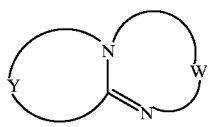
(VI)

wherein Y and W, which are the same or different, each represents a straight-chain, branched or cyclic alkylene group which may contain a hetero atom or may be substituted.

(13) The positive resist laminate as described in item (1), wherein the first resist layer has a thickness of from 0.1 to 2.0 µm.

(14) The positive resist laminate as described in item (1), wherein the second resist layer has a thickness of from 0.03 to 0.6 µm.

(15) The positive resist laminate as described in item (1), wherein the polymer (a-1) contains the repeating unit represented by formula (1) in a content of from 10 to 90% by mole.

(16) The positive resist laminate as described in item (1), wherein the polymer (a-1) contains the repeating unit represented by formula (2) in a content of from 10 to 90% by mole.

(17) The positive resist laminate as described in item (1), wherein the first resist layer contains the polymer (a-1) in a content of 70 to 98% by weight based on the solid content.

(18) The positive resist laminate as described in item (1), wherein the second resist layer contains the polymer (b) in a content of 40 to 99% by weight based on the solid content.

(19) The positive resist laminate as described in item (1), which comprises the substrate, the first resist layer provided on the substrate and the second resist layer provided on the first resist layer.

DETAILED DESCRIPTION OF THE INVENTION

Preferred embodiments of the present invention will be described in greater detail below, but the present invention should not be construed as being limited thereto.

The positive resist laminate of the present invention comprises: a substrate;

a first resist layer containing (a-1) a polymer containing a repeating unit represented by formula (1) and a repeating unit represented by formula (2) (hereinafter also referred to as "polymer (a-1)" or "component (a-1)" sometimes); and a second resist layer containing (b) a polymer which contains a silicon atom in the side chain thereof and which is insoluble in water and becomes soluble in an aqueous alkali solution by the action of an acid (hereinafter also referred to as "polymer (b)" or "component (b)" sometimes).

Preferred polymer (b) includes:

(b-1) a polymer containing a repeating unit represented by formula (4) describe above and at least one repeating unit selected from those represented by formulae (5a) and (5b) describe above (hereinafter also referred to as "polymer (b-1)" sometimes); and (b-2) a polymer containing a repeating unit represented by formula (4) described above, at least one repeating unit selected from those represented by formulae (5a) and (5b) described above and a repeating unit represented by formula (6) described above (hereinafter also referred to as "polymer (b-2)" sometimes).

Other preferred polymer (b) includes:

(b-3) a polymer containing a repeating unit represented by formula (7) describe above (hereinafter also referred to as "polymer (b-3)" sometimes); and (b-4) a polymer containing a repeating unit represented by formula (7) described above and at least one repeating unit selected from those represented by formulae (5a) and (5b) described above (hereinafter also referred to as "polymer (b-4)" sometimes).

In order to highly achieve the objects of the present invention, in polymer (a-1) contained in the first resist layer, a content of the repeating unit represented by formula (1) is preferably from 10 to 90% by mole, more preferably from 20 to 80% by mole and particularly preferably from 25 to 75% by mole. A content of the repeating unit represented by formula (2) is preferably from 10 to 90% by mole, more preferably from 20 to 80% by mole and particularly preferably from 25 to 75% by mole.

In formula (1), $Y^1$ preferably represents a hydrogen atom, an alkyl group having from 1 to 3 carbon atoms, a cyano group or a halogen atom (e.g., chlorine, bromine or iodine). More preferably $Y^1$ represents a hydrogen atom or an alkyl group having from 1 to 3 carbon atoms. A hydrogen atom and a methyl group are particularly preferred for $Y^1$.

$L^1$ represents a divalent linkage group and preferably include an alkylene group, an arylene group and an aralkylene group. The divalent group may have a substituent and examples of the substituent include a halogen atom (e.g., chlorine, bromine or fluorine), a cyano group, a hydroxy group, an amino group, —NH($R^9$)-(wherein $R^9$ represents an alkyl group having from 1 to 4 carbon atoms), an alkyl group having from 1 to 4 carbon atoms, a cycloalkyl group having from 3 to 8 carbon atoms, an aryl group having from 6 to 12 carbon atoms and an aralkyl group having from 7 to 14 carbon atoms. More preferably $L^1$ represents an alkylene group having from 1 to 8 carbon atoms which may be substituted, a phenylene group which may be substituted or an aralkylene group having from 7 to 10 carbon atoms which may be substituted. An alkylene group having from 2 to 6 carbon atoms which may be substituted and a phenylene group which may be substituted are particularly preferred for $L^1$.

a1 represents 0 or 1.

J represents an alicyclic hydrocarbon group and preferably includes a cycloalkyl group having from 3 to 8 carbon atoms and a bridged alicyclic hydrocarbon group having from 4 to 30 carbon atoms. The alicyclic hydrocarbon group may be substituted and examples of the substituent include those described for $L^1$ above. More preferably J represents a bridged alicyclic hydrocarbon group having from 5 to 25 carbon atoms and preferred examples of skeleton therefor are set forth below.

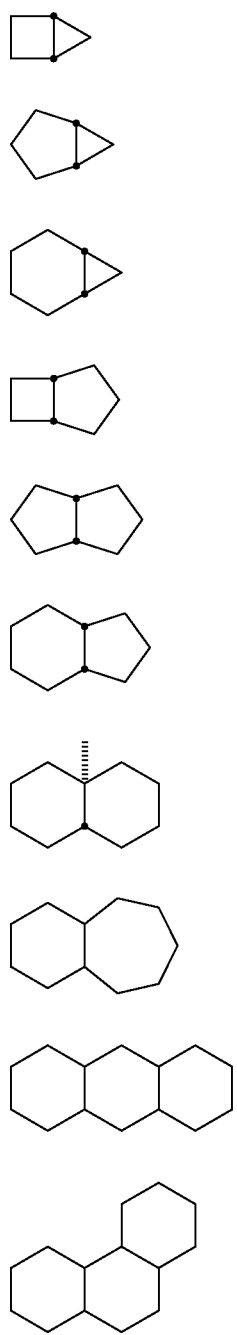

(1)
(2)
(3)
(4)
(5)
(6)
(7)
(8)
(9)
(10)

-continued

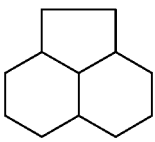

(11)

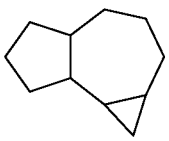

(12)

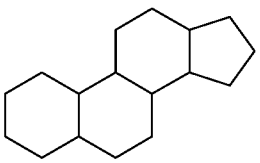

(13)

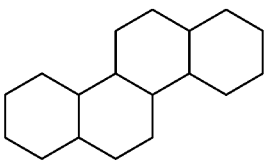

(14)

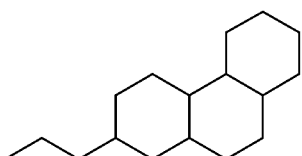

(15)

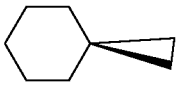

(16)

(17)

(18)

(19)

(20)

-continued
(21) 
(22) 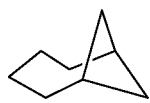
(23) 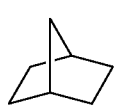
(24) 
(25) 
(26) 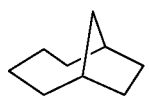
(27) 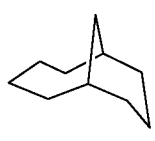
(28) 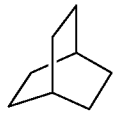
(29) 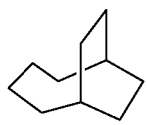
(30) 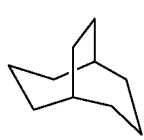
(31) 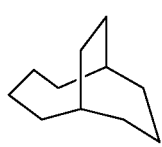
-continued
(32) 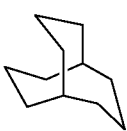
(33) 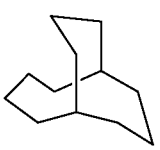
(34) 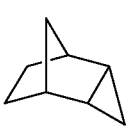
(35) 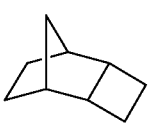
(36) 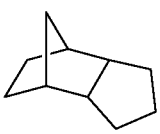
(37) 
(38) 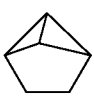
(39) 
(40) 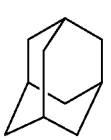
(41) 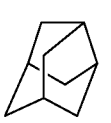
(42) 

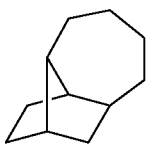
(43)

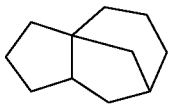
(44)

(45)

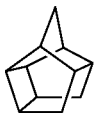
(46)

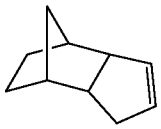
(47)

Of these skeletons, (5), (6), (7), (8), (9), (10), (13), (14), (15), (23), (28), (36), (37), (40), (42) and (47) are particularly preferred.

In formula (2), $Y^2$ has the same meaning as defined for $Y^1$. $L^2$ has the same meaning as defined for $L^1$. K preferably represents an aryl group having from 6 to 20 carbon atoms which may be substituted, and examples of the substituent include those described for $L^1$ above. More preferably K represents an aryl group having from 6 to 15 carbon atoms which may be substituted. A phenyl group which may be substituted, a naphthyl group which may be substituted, an anthryl group which may be substituted and a phenanthryl group which may be substituted are particularly preferred for K. a2 and a3, which may be the same or different, each represents 0 or 1.

It is preferred that in formulae (1) and (2), at least one of the groups represented by $L^1$, $L^2$, J and K has a hydroxy group, an amino group or —NH($R^9$)— (wherein $R^9$ represents an alkyl group having from 1 to 4 carbon atoms) as a substituent. Of these substituents, a hydroxy group is particularly preferred. Further, these substituents may be contained in other copolymerizable components.

A content of the polymer in the first resist layer according to the present invention is preferably from 70 to 98% by weight, more preferably from 80 to 95% by weight. When the content of polymer is less than 70% by weight, film-forming property and dry-etching resistance may tends to degrade, and on the other hand, if the content of polymer is more than 98% by weight, heat-hardening property may tends to deteriorate.

In order to highly achieve the objects of the present invention, it is preferred for the first resist layer to contain (a-2) a crosslinking agent (hereinafter also referred to as a "heat-crosslinking agent" sometimes) which is activated by an acid to react with the polymer (a-1), thereby forming a crosslinking structure and (a-3) a compound (hereinafter also referred to as a "heat-acid generator" sometimes) which generates an acid by heat.

As the heat-crosslinking agent, those conventionally known can be widely employed. Examples of the heat-crosslinking agent preferably used include a melamine compound, benzoguanamine compound, glycoluril compound and urea compound each substituted with at least one group selected from a methylol group, an alkoxymethyl group and an acyloxymethyl group.

Examples of the alkoxymethyl group include methoxymethyl, ethoxymethyl, propoxymethyl and butoxymethyl groups.

Examples of the acyloxymethyl group include acetyloxymethyl group.

The number of the methylol group, alkoxymethyl group and acyloxymethyl group included in these compounds is from 2 to 6, preferably from 5 to 6 per molecule in case of the melamine compound, from 2 to 4, preferably from 3 to 4 per molecule in case of the benzoguanamine compound and glycoluril compound, and from 3 to 4 per molecule in case of the urea compound.

Of these compounds, hexamethoxymethylmelamine, tetramethoxymethylbenzoguanamine and tetramethoxymethylgrycoluril are particularly preferred in view of heat-crosslinking property and preservation stability.

The compound containing methylol group is obtained by reacting melamine, guanamine or urea with formalin in the presence of a basic catalyst, for example, sodium hydroxide, potassium hydroxide, ammonia or tetraalkylammoniumhydroxide.

The compound containing alkoxymethyl group is obtained by heating the above-described compound containing methylol group in an alcohol in the presence of an acid catalyst, for example, hydrochloric acid, sulfuric acid, nitric acid or methanesulfonic acid.

The compound containing acyloxymethyl group is obtained by reacting the above-described compound containing methylol group with an acid anhydride or acid halide in the presence of a basic catalyst.

A content of the heat-crosslinking agent in the first resist layer is preferably from 2 to 50% by weight, more preferably from 5 to 30% by weight in terms of solid content.

The heat-acid generators include those which begin to generate an acid at a temperature of preferably from 150 to 220° C., more preferably from 170 to 200° C. Further, a sulfonic acid ester compound and a diaryliodonium salt compound are preferably used as the heat-acid generator.

The sulfonic acid ester compound preferably includes an organic sulfonic acid ester having from 3 to 20 carbon atoms. Specific preferred examples thereof include a sulfonic acid ester of secondary alcohol, for example, 2-propanol, 2-butanol, 2-pentanol or cyclohexanol.

The diaryliodonium salt compound includes a salt of diaryliodonium cation with an organic sulfonic acid anion, $SbF_6$ anion, $PF_6$ anion or $AsF_6$ anion. Of these anions, the organic sulfonic acid anion is preferred.

The diaryliodonium salt compound used includes specifically the following compounds, but the present invention should not be construed as being limited thereto.

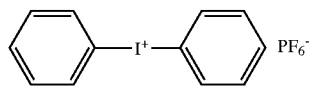 (TAG1)
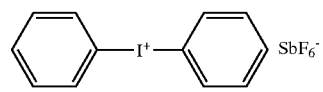 (TAG2)
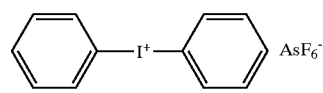 (TAG3)
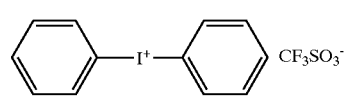 (TAG4)
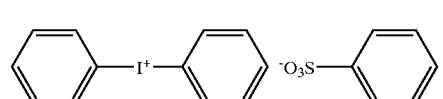 (TAG5)
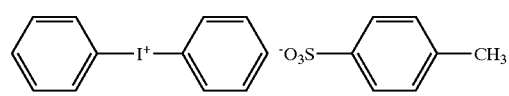 (TAG6)
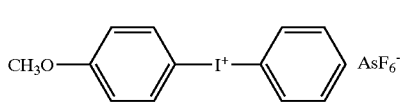 (TAG7)
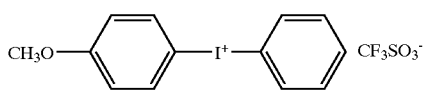 (TAG8)
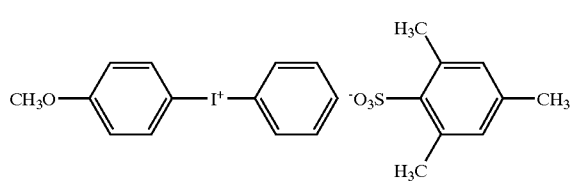 (TAG9)
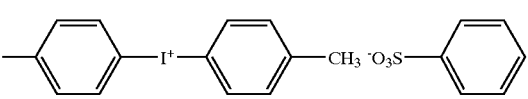 (TAG10)
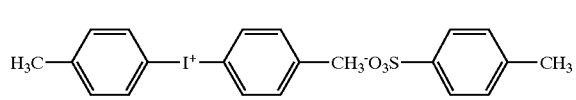 (TAG11)
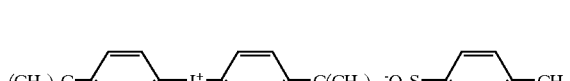 (TAG12)
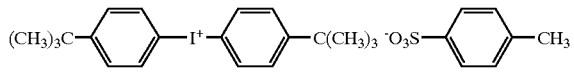 (TAG13)

-continued
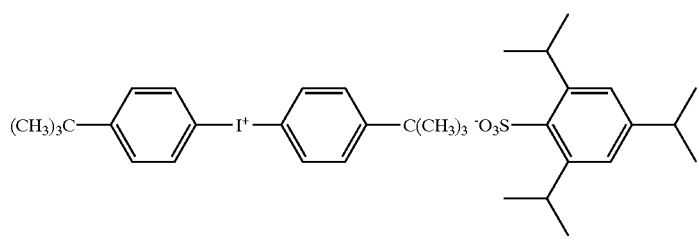
(TAG14)
(TAG15)
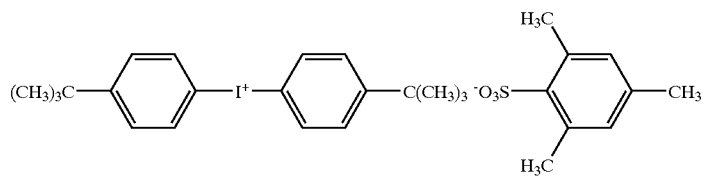
(TAG16)
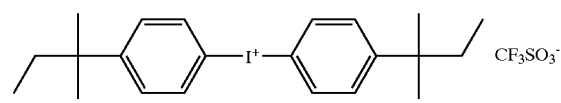
(TAG17)
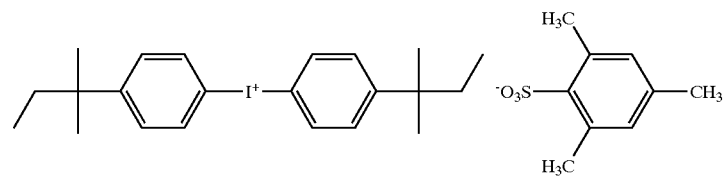
(TAG18)
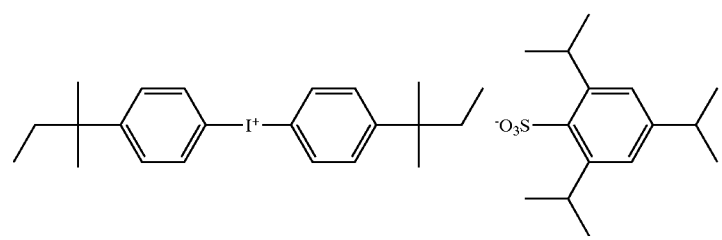
(TAG19)
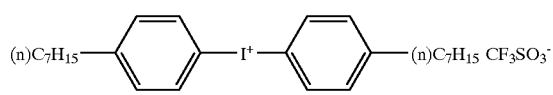
(TAG20)
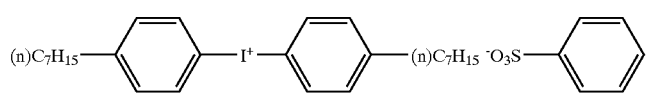
(TAG21)
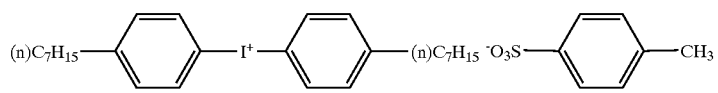
(TAG22)
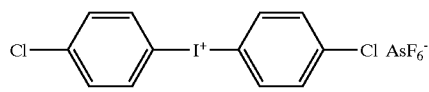
(TAG23)
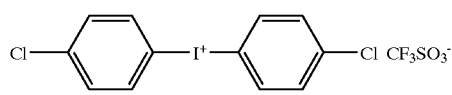

-continued

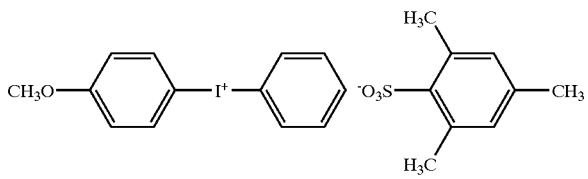
(TAG24)

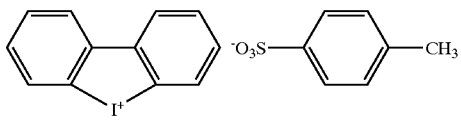
(TAG25)

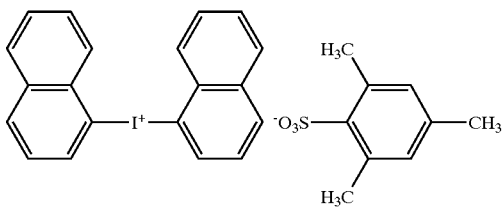
(TAG26)

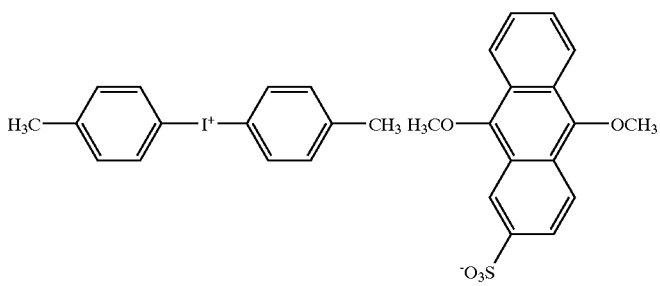
(TAG27)

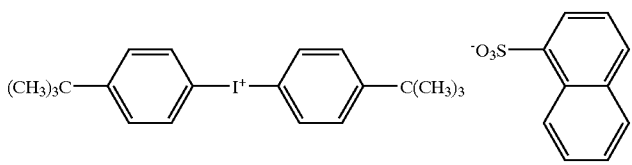
(TAG28)

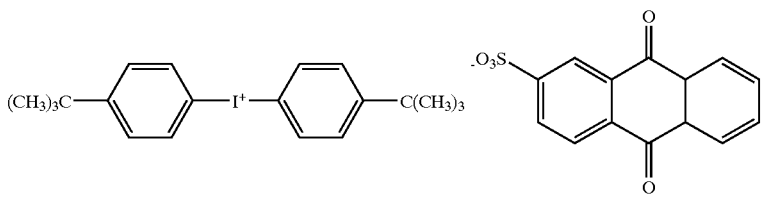
(TAG29)

Of these compounds, salts of diaryliodonium with organic sulfonic acid are preferred in view of stability and solubility in a solvent.

Particularly, a salt of a diaryliodonium cation which has a straight-chain or branched alkyl group having from 1 to 12 carbon atoms or an alkoxy group having from 1 to 12 carbon atoms on the aryl moiety as a substituent with an organic sulfonic acid anion is preferred also in view of safety.

Examples of the straight-chain or branched alkyl group having from 1 to 12 carbon atoms or alkoxy group having from 1 to 12 carbon atoms include methyl, ethyl, n-propyl, isopropyl, n-butyl, sec-butyl, isobutyl, tert-butyl, n-amyl, isoamyl, tert-amyl, n-hexyl, n-heptyl, n-octyl, 2-ethylhexyl, n-decyl, n-dodecyl, cyclopropyl, cyclopentyl, cyclohexyl, methoxy, ethoxy, propoxy and butoxy groups.

Examples of the aryl moiety described above include phenyl, naphthyl, anthryl and phenanthryl groups.

As the organic sulfonic acid anion, trifluoromethanesulfonate, methanesulfonate and an arylsulfonate which may have a straight-chain or branched alkyl group having from 1 to 12 carbon atoms, an alkoxy group having from 1 to 12 carbon atoms or a halogen atom on the aryl moiety as a substituent are preferred in view of solubility in a solvent. Examples of the aryl moiety include those described for the diaryliodonium cation above.

The heat-acid generators may be used individually or in combination of two or more thereof.

The heat-acid generator is used ordinarily from 0.5 to 10 parts by weight, preferably from 1 to 5 parts by weight, based on 100 parts by weight of the resist composition of the first resist layer in terms of solid content.

The polymer (a-1) used in the present invention may be a copolymer containing one or more other repeating units in addition to the repeating units represented by formulae (1) and (2) for the purpose of improving film-forming property, adhesion to a substrate, developing property and the like.

Examples of monomer corresponding to other repeating units include compounds having one addition-polymerizable unsaturated bond, for example, acrylates, methacrylates, acrylamides, methacrylamides, allyl compounds, vinyl ethers and vinyl esters.

More specifically, the above compounds include:

acrylates such as alkyl acrylates (preferably those containing an alkyl group having from 1 to 10 carbon atoms), e.g., methyl acrylate, ethyl acrylate, propyl acrylate, amyl acrylate, cyclohexyl acrylate, ethylhexyl acrylate, octyl acrylate, tert-octyl acrylate, chloroethyl acrylate, trimethylolpropane monoacrylate, pentaerythritol monoacrylate, benzyl acrylate, methoxybenzyl acrylate, furfuryl acrylate and tetrahydrofurfuryl acrylate);

methacrylates such as alkyl methacrylates (preferably those containing an alkyl group having form 1 to 10 carbon atoms), e.g., methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, trimethylolpropane monomethacrylate, pentaerythritol monomethacrylate, furfuryl methacrylate and tetrahydrofurfuryl methacrylate);

acrylamides such as acrylamide, N-alkylacrylamides (the alkyl group of which is an alkyl group having from 1 to 10 carbon atoms, e.g., methyl, ethyl, propyl, butyl, tert-butyl, hepthyl, octyl, cyclohexyl and hydroxyethyl), N,N-dialkylacrylamides (the alkyl group of which is an alkyl group having form 1 to 10 carbon atoms, e.g., methyl, ethyl, butyl, isobutyl, ethylhexyl and cyclohexyl), N-hydroxyethyl-N-methylacrylamide and N-2-acetamidoethyl-N-acetylacrylamide;

methacrylamides such as methacrylamide, N-alkylmethacrylamides (the alkyl group of which is an alkyl group having from 1 to 10 carbon atoms, e.g., methyl, ethyl, tert-butyl, ethylhexyl, hydroxyethyl and cyclohexyl), N,N-dialkylmethacrylamides (the alkyl group of which includes, e.g., ethyl, propyl and butyl) and N-hydroxyethyl-N-methylmethacrylamide;

allyl compounds such as allyl esters (e.g., allyl acetate, allyl caproate, ally caprate, allyl laurate, allyl palmitate, allyl stearate, allyl benzoate, allyl acetoacetate and ally lactate) and allyl oxyethanol;

vinyl ethers such as alkyl vinyl ethers (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether and tetrahydrofurfuryl vinyl ether);

vinyl esters such as vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl acetoacetate, vinyl lactate, vinyl β-phenylbutyrate and vinyl cyclohexylcarboxylate;

dialkyl itaconates (e.g., dimethyl itaconate, diethyl itaconate and dibutyl itaconate);

dialkyl fumarates (e.g., dibutyl fumarate) and monoalkyl fumarates;

acrylic acid, methacrylic acid, crotonic acid, itaconic acid, maleic anhydride, maleimide, acrylonitrile, methacrylonitrile and maleonitrile.

Other addition-polymerizable unsaturated compounds copolymerizable with the above-described repeating units may be employed.

A weight average molecular weight (measured by GPC and calculated in terms of polystyrene) of polymer (a-1) for use in the present invention is not particularly limited, but preferably from 1,000 to 1,000,000, more preferably from 2,000 to 100,000 in view of compatibility with the heat-crosslinking agent of component (a-2) and heat-acid generator of component (a-3), organic solvent aptitude, film-forming property and the like.

Specific examples of polymer (a-1) for use in the first resist layer of the present invention are set forth below, but the present invention should not be construed as being limited thereto. In the following formulae, each numeral attached to the parentheses denotes a molar ratio of the repeating unit.

(P-1)

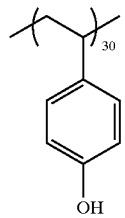 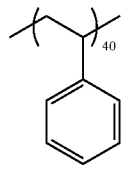 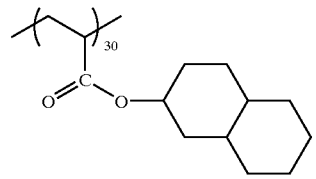

Mw = 19200

(P-2)
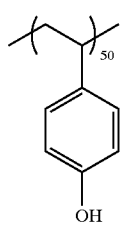 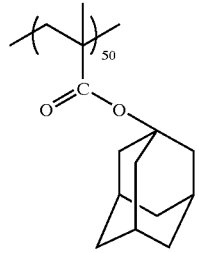
Mw = 12600
(P-3)
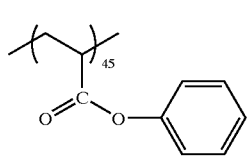 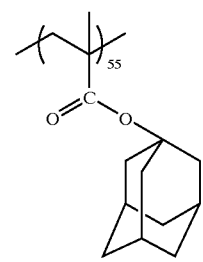
Mw = 15100
(P-4)
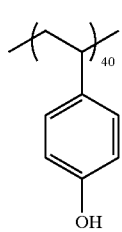 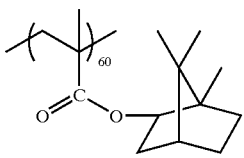
Mw = 11500
(P-5)
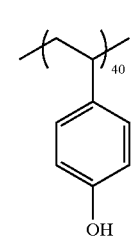 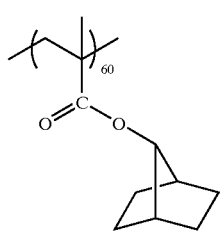
Mw = 19000
(P-6)
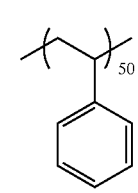 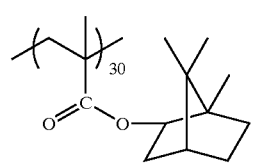 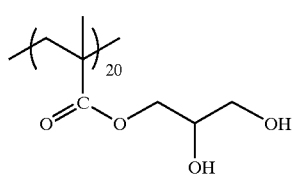
Mw = 13400

-continued
(P-7)
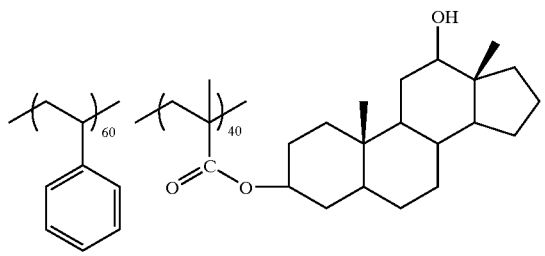
Mw = 16100
(P-8)
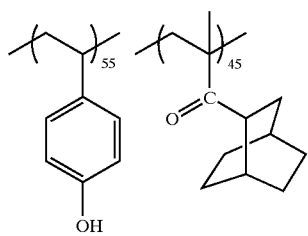
Mw = 22500
(P-9)
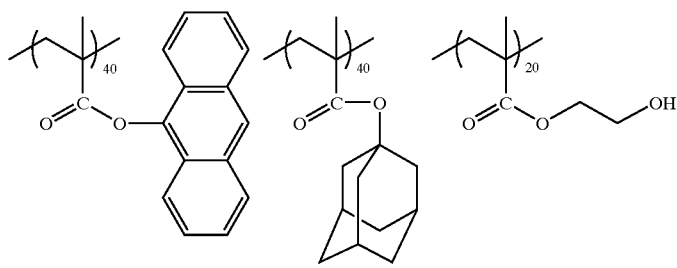
Mw = 9800
(P-10)
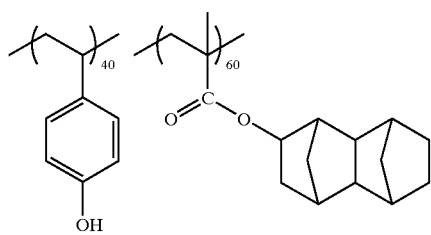
Mw = 19500
(P-11)
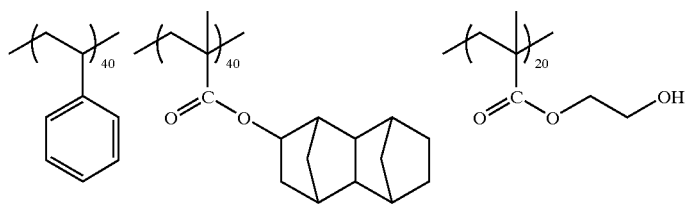
Mw = 13000

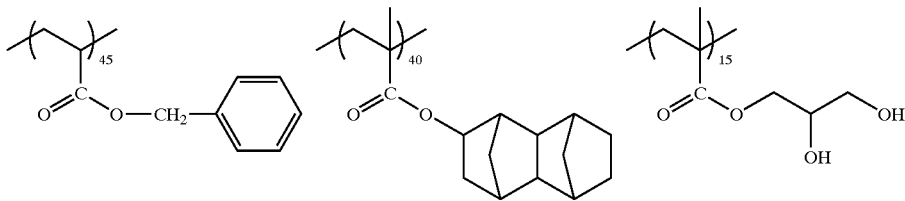

Mw = 11000

The first resist layer of the present invention may further contain one or more other polymers in addition to the above-described polymer (a-1), heat-crosslinking agent (a-2) and heat-acid generator (a-3) for the purpose of improving film-forming property, heat resistance, dry-etching resistance and the like.

Preferred examples of such polymers include novolak resins and more specifically, phenol-aldehyde resin, o-cresol-formaldehyde resin, p-cresol-formaldehyde resin, xylenol-formaldehyde resin and a co-condensation product thereof. Further, a condensate of a phenol substituted with an alkyl group having from 3 to 8 carbon atoms or cresol and formaldehyde such as tert-butylphenol-aldehyde resin may be used together with the above-described phenol resin as described in JP-A-50-125806.

Moreover, a polymer comprising a copolymer component formed from a phenolic hydroxy group-containing monomer such as N-(4-hydroxyphenyl)methacrylamide, a homopolymer or copolymer of p-hydroxystyrene, o-hydroxystyrene, m-isopropenylphenol, p-isopropenylphenol or the like, or a polymer formed by partial etherification or partial esterification of the above-described polymers may also emploed.

The first resist layer of the present invention may contain an aromatic polyhydroxy compound as described in JP-A-4-122938, JP-A-2-275955 and JP-A-4-230754, if desired.

The first resist layer of the present invention may also contain an organic basic compound.

A solvent for dissolving components (a-1), (a-2) and (a-3) for use in the first resist layer of the present invention includes a highly polar solvent, for example, a ketone such as methyl ethyl ketone or cyclohexanone, an alcohol ether such as ethylene glycol monomethyl ether or ethylene glycol monoethyl ether, an ether such as dioxane or ethylene glycol dimethyl ether, a cellosolve ester such as methyl cellosolve acetate or ethyl cellosolve acetate, a fatty acid ester such as butyl acetate, methyl lactate or ethyl lactate, a halogenated hydrocarbon such as 1,1,2-trichloroethylene, dimetylacetamide, N-methylpyrrolidone, dimethylformamide or dimethylsulfoxide. The solvents may be used individually or as a mixture of two or more thereof.

The first resist layer of the present invention may also contain a dye, a plasticizer, an adhesion assistant, a surfactant and the like, if desired. Specific examples thereof include a dye such as Methyl Violet, Crystal Violet or Malachite Green, a plasticizer such as stearic acid, acetal resin, phenoxy resin, alkyd resin or epoxy resin, an adhesion assistant such as hexamethyldisilazane or chloromethylsilane, and a surfactant such as nonylphenoxypoly(ethyleneoxy)ethanol or octylphenoxypoly(etyleneoxy)ethanol.

Of the dyes, a dye containing an alkali-soluble group such as an aromatic hydroxy group or a carboxy group in the molecule thereof, for example, glutamine is particularly preferred.

Now, polymer (b-1) and polymer (b-2) of polymer (b) for use in the second resist layer will be described below.

In the repeating unit represented by formula (4), $R^2$, $R^3$ and $R^4$, which may be the same or different, each represents a group selected from an alkyl group, a haloalkyl group, a halogen atom, an alkoxy group, a trialkylsilyl group and a trialkylsilyloxy group.

Examples of the alkyl group include preferably a straight-chain or branched alkyl group having from 1 to 10 carbon atoms, more preferably a straight-chain or branched alkyl group having form 1 to 6 carbon atoms, and still more preferably methyl, ethyl, n-propyl, isopropyl, n-butyl, isobutyl, sec-butyl and tert-butyl groups.

Examples of the haloalkyl group include chloromethyl, bromomethyl and iodomethyl groups.

Examples of the alkoxy group include preferably a straight-chain or branched alkoxy group having form 1 to 6 carbon atoms, and more preferably methoxy, ethoxy, n-propyloxy, isopropyloxy, n-butoxy, isobutoxy, sec-butoxy and tert-butoxy groups. Methoxy and ethoxy groups are particularly preferred.

Examples of an alkyl group in the trialkylsilyl group include preferably a straight-chain or branched alkyl group having form 1 to 6 carbon atoms, and more preferably methyl, ethyl, n-propyl, isopropyl, n-butyl, isobutyl, sec-butyl and tert-butyl groups. A methyl group is particularly preferred.

Examples of an alkyl group in the trialkylsilyloxy group include preferably a straight-chain or branched alkyl group having form 1 to 6 carbon atoms, and more preferably methyl, ethyl, n-propyl, isopropyl, n-butyl, isobutyl, sec-butyl and tert-butyl groups. A methyl group is particularly preferred.

n represents 0 or 1.

Specific examples of the repeating unit represented by formula (4) are set forth below, but the present invention should not be construed as being limited thereto.

-continued

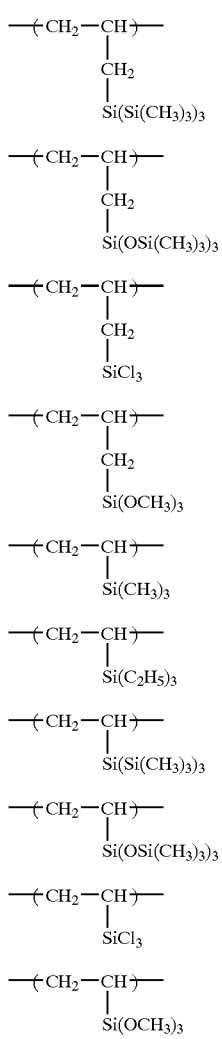

(1-3), (1-4), (1-5), (1-6), (1-7), (1-8), (1-9), (1-10), (1-11), (1-12)

In the repeating unit represented by formula (5a), $Y^5$ has the same meaning as defined for $Y^1$; $L^3$ represents a mere bond or a divalent linkage group; and Q represents a group which is decomposable by an acid to generate a carboxylic acid.

Specific examples of Q include a tertiary alkyl group such as a tert-butyl or tert-amyl group, an isobornyl group, an 1-alkoxyethyl group such as an 1-ethoxyethyl, 1-butoxyethyl, 1-isobutoxyethyl or 1-cyclohexyloxyethyl group, an alkoxymethyl group such as an 1-metoxymethyl or 1-ethoxymethyl group, a tetrahydropyranyl group, a tetrahydrofurfuryl group, a trialkylsilyl group, a 3-oxocyclohexyl group, a 2-methyl-2-adamantyl group, a mevalonic lactone residue and a 2-(γ-butyrolactonyloxycarbonyl)-2-propyl group.

The divalent linkage group represented by $L^3$ is preferably an arylene group which may have a substituent. Examples of the substituent for the arylene group include those described for $L^1$ in formula (1). A mere bond, a phenylene group and a naphthylene group are particularly preferred for $L^3$.

In the repeating unit represented by formula (5b), $X^1$ and $X^2$, which may be the same or different, each represents a group selected from an oxygen atom, a sulfur atom, —NH— and —NHSO$_2$—.

$L^{11}$ and $L^{12}$, which may be the same or different, each represents a mere bond or a divalent linkage group.

Examples of the divalent linkage group for $L^{11}$ and $L^{12}$ include an alkylene group, a substituted alkylene group, an ether group, a thioether group, a carbonyl group, an ester group, an amido group, a sulfonamido group, a urethane group, a urea group and a combination of two or more of these groups.

Examples of the alkylene group or substituted alkylene group represented by $L^{11}$ and $L^{12}$ include a group represented by the following formula:

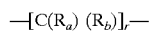

wherein $R_a$ and $R_b$, which may be the same or different, each represents a hydrogen atom, an alkyl group, a substituted alkyl group, a halogen atom, a hydroxy group or an alkoxy group; and r represents an integer of from 1 to 10.

Examples of the alkyl group for $R_a$ or $R_b$ include preferably a lower alkyl group such as methyl, ethyl, propyl, isopropyl and butyl groups. More preferably, the alkyl group is a methyl, ethyl, propyl or isopropyl group.

Examples of the substituent present in the substituted alkyl group include a hydroxy group, a halogen atom and an alkoxy group.

Examples of the alkoxy group include preferably an alkoxy group having from 1 to 4 carbon atoms such as methoxy, ethoxy, propoxy and butoxy groups.

Examples of the halogen atom include chlorine, bromine, fluorine and iodine atoms.

$A^1$ and $A^2$, which may be the same or different, each represents a hydrogen atom, a cyano group, a hydroxy group, —COOH, —COOR$^5$, —CO—NH-R$^6$, an alkyl group which may be substituted, an alkoxy group which may be substituted or —COOQ; $R^5$ and $R^6$, which may be the same or different, each represents an alkyl group which may be substituted.

Examples of the alkyl group for $A^1$, $A^2$, $R^5$ and $R^6$ include preferably a straight-chain or branched alkyl group having from 1 to 10 carbon atoms, more preferably a straight-chain or branched alkyl group having form 1 to 6 carbon atoms, and still more preferably methyl, ethyl, n-propyl, isopropyl, n-butyl, isobutyl, sec-butyl and tert-butyl groups.

Examples of the alkoxy group for $A^1$ and $A^2$ include preferably a straight-chain or branched alkoxy group having form 1 to 6 carbon atoms, and more preferably methoxy, ethoxy, n-propyloxy, isopropyloxy, n-butoxy, isobutoxy, sec-butoxy and tert-butoxy groups. Methoxy group and ethoxy group are particularly preferred.

Q represents a group which is decomposable by an acid to generate a carboxylic acid.

Specific examples of Q include those described for Q in formula (5a) above.

Specific examples of the repeating unit represented by formula (5a) are set forth below, but the present invention should not be construed as being limited thereto.

(5a-1)

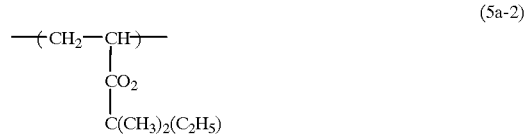

(5a-2)

(5a-3) 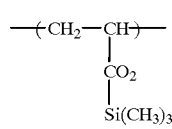
(5a-4) 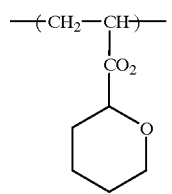
(5a-5) 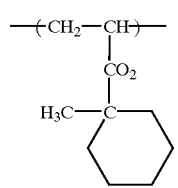
(5a-6) 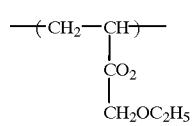
(5a-7) 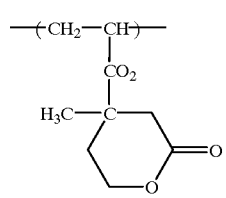
(5a-8) 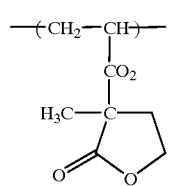
(5a-9) 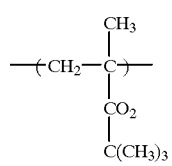
(5a-10) 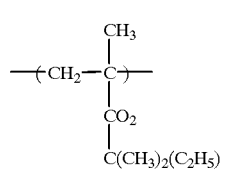
(5a-11) 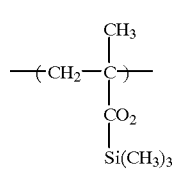
(5a-12) 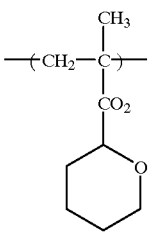
(5a-13) 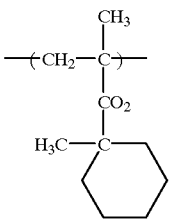
(5a-14) 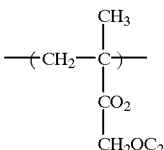
(5a-15) 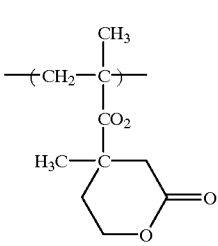
(5a-16) 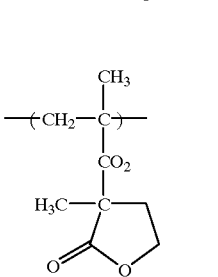
Specific examples of the repeating unit represented by formula (5b) are set forth below, but the present invention should not be construed as being limited thereto.
[5b-1] 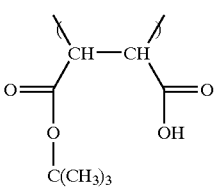

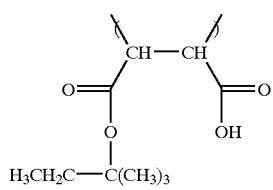
[5b-2]
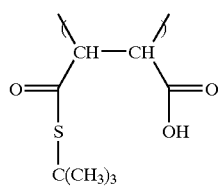
[5b-3]
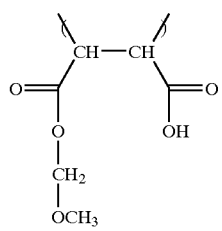
[5b-4]
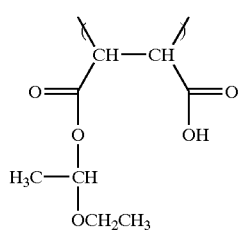
[5b-5]
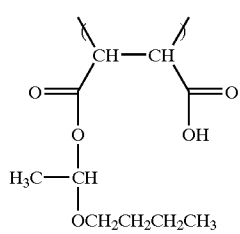
[5b-6]
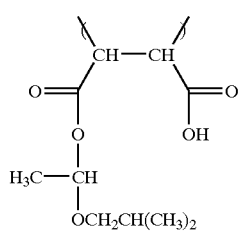
[5b-7]
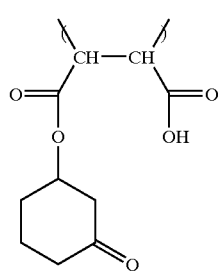
[5b-8]
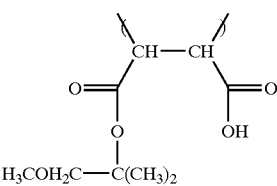
[5b-9]
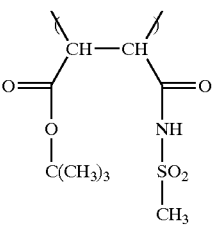
[5b-10]
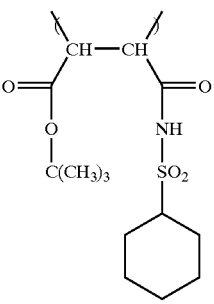
[5b-11]
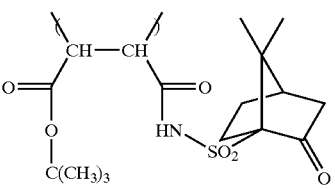
[5b-12]
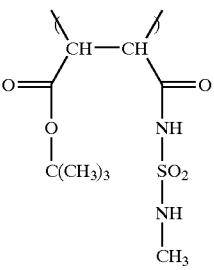
[5b-13]
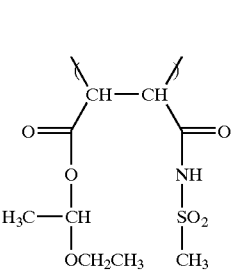
[5b-14]
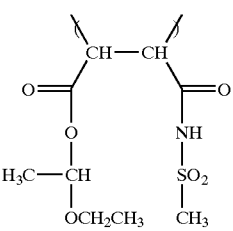

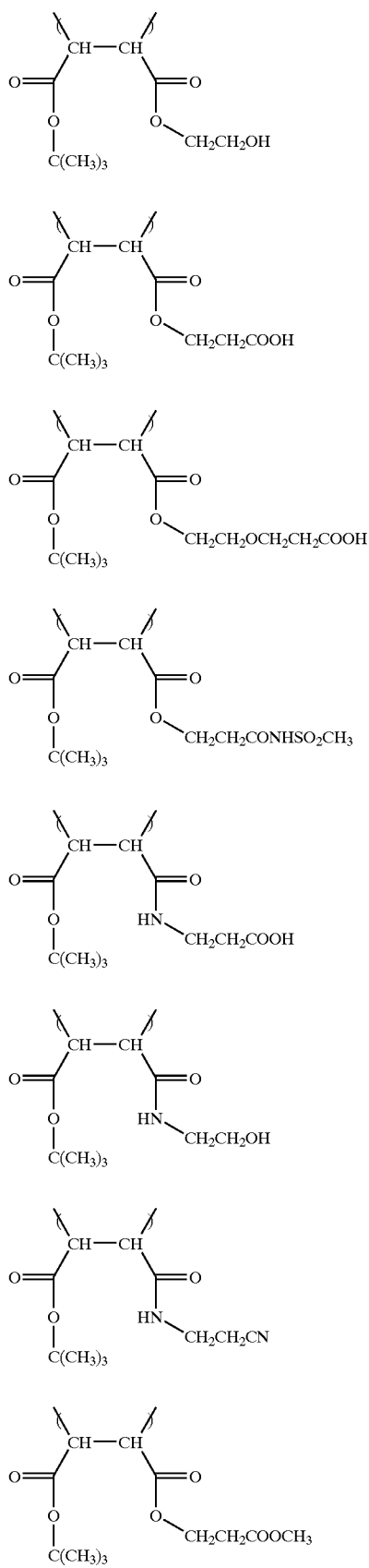
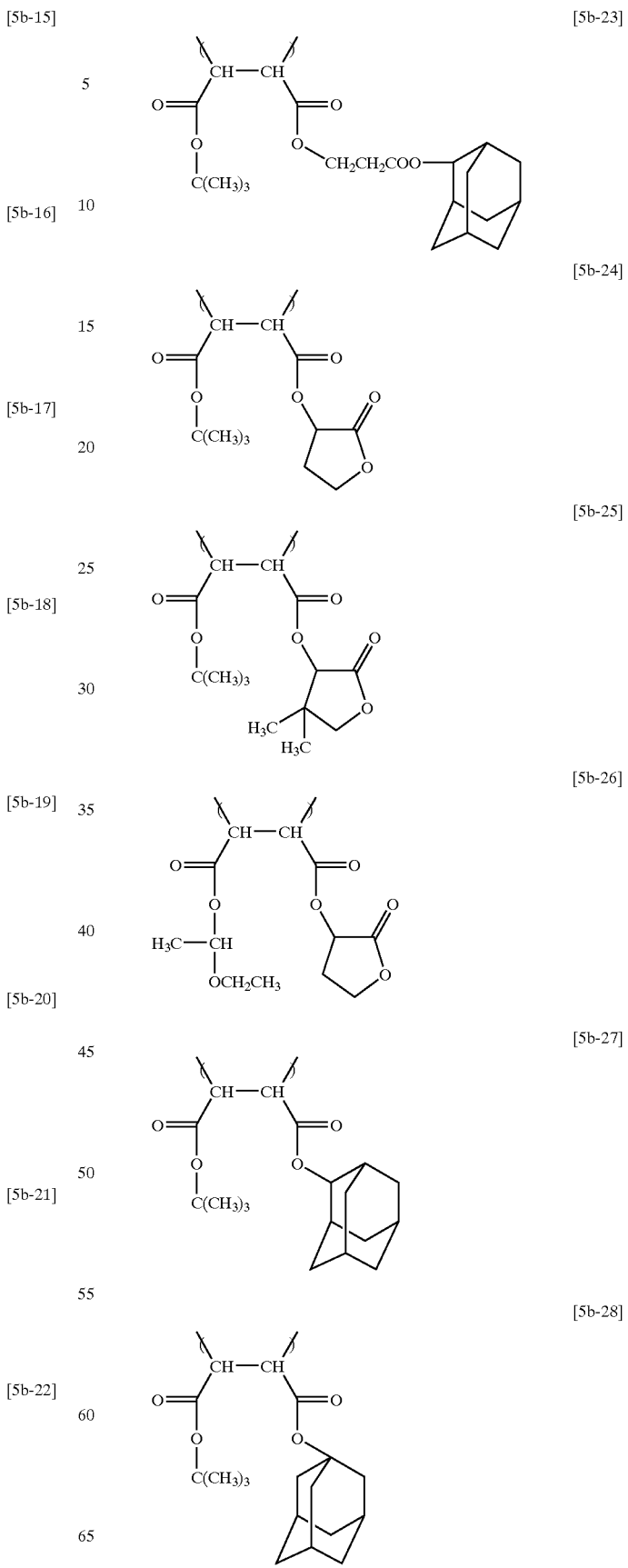

[5b-29] 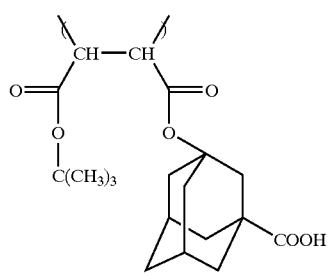
[5b-30] 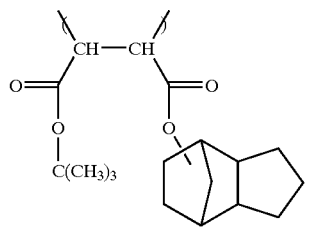
[5b-31] 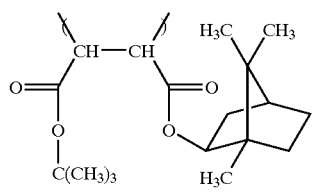
[5b-32] 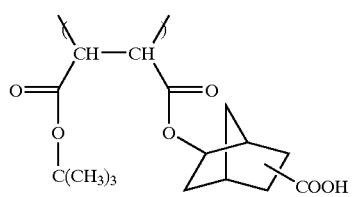
[5b-33] 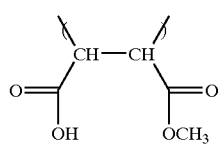
[5b-34] 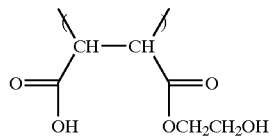
[5b-35] 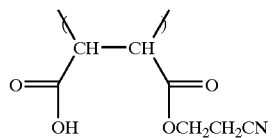
[5b-36] 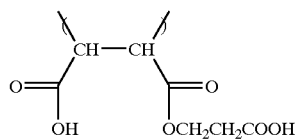
[5b-37] 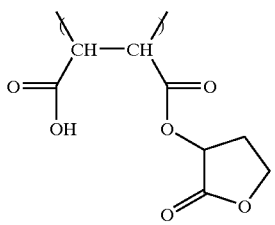
[5b-38] 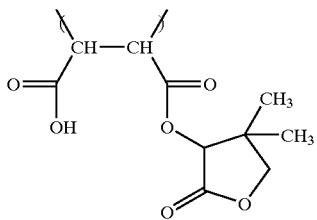
[5b-39] 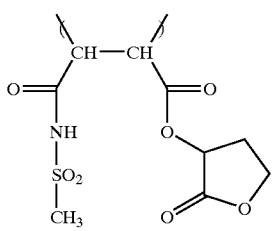
[5b-40] 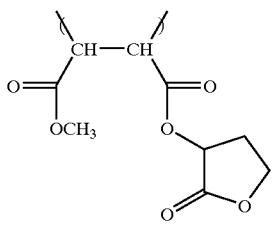
[5b-41] 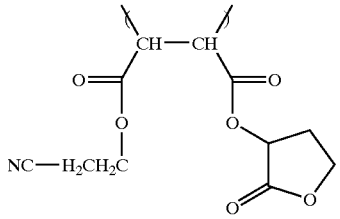
[5b-42] 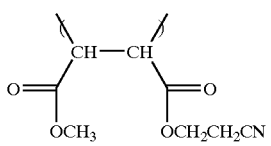
[5b-43] 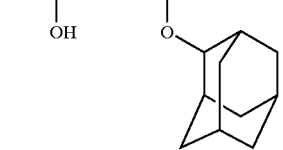

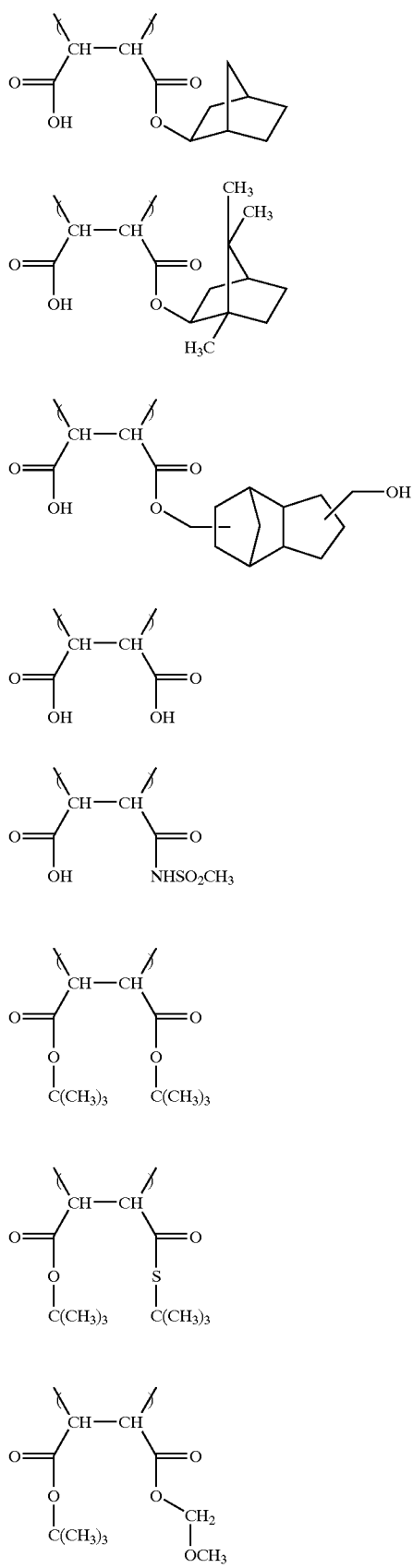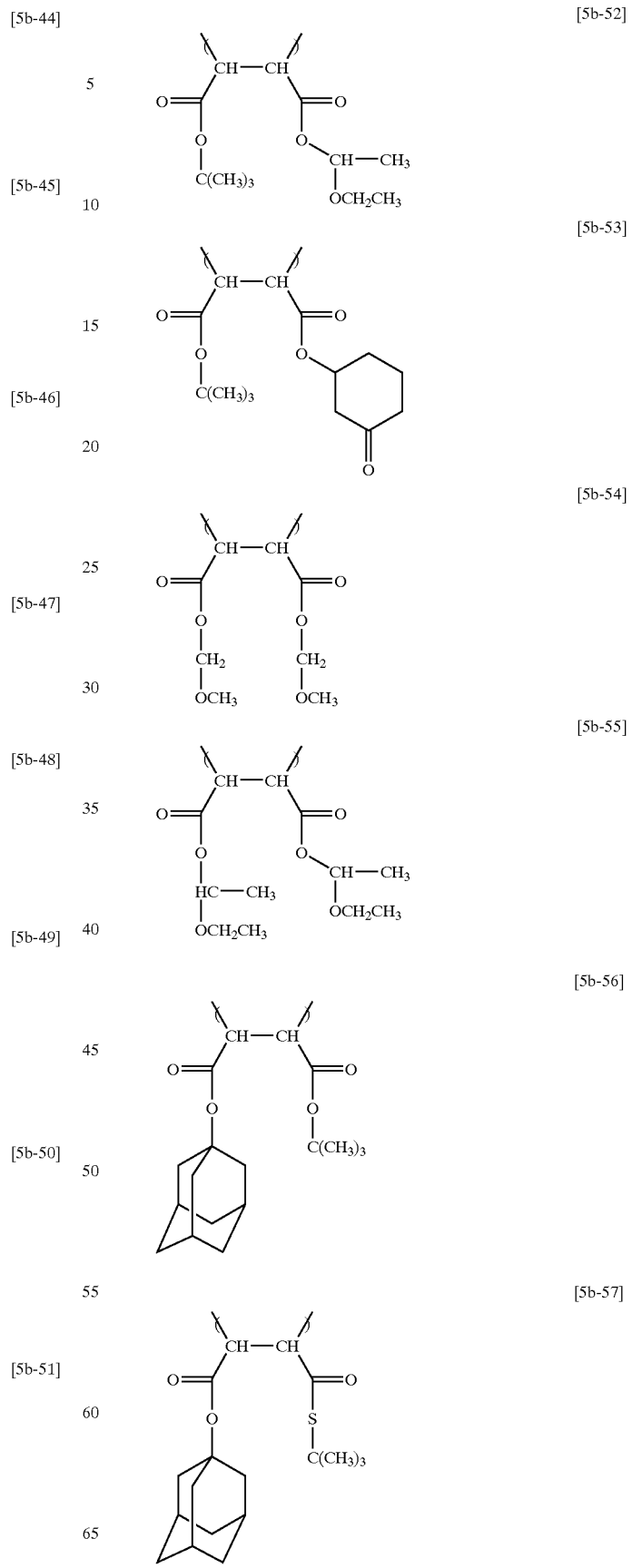

[5b-58] 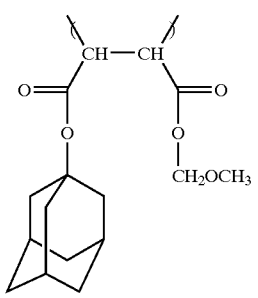

[5b-59] 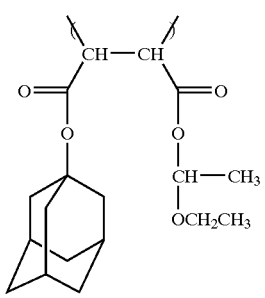

[5b-60] 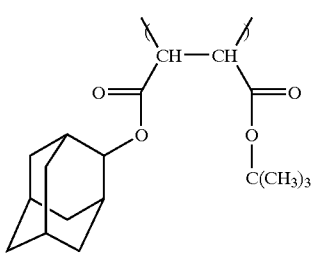

[5b-61] 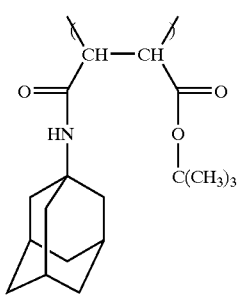

[5b-62] 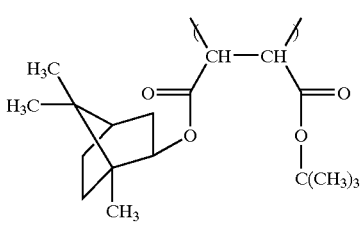

[5b-63] 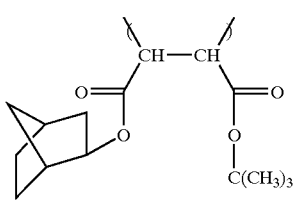

[5b-64] 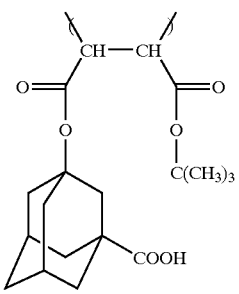

[5b-65] 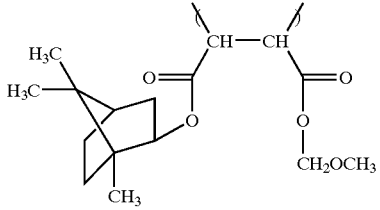

In formula (6), Z represents an oxygen atom or N—$R^7$; $R^7$ represents a hydrogen atom, a hydroxy group, a straight-chain or branched alkyl group, a trihalomethyl group or —O—$SO_2$—$R^8$; and $R^8$ represents an alkyl group, a trihalomethyl group or camphor residue.

Examples of the alkyl group include preferably a straight-chain or branched alkyl group having from 1 to 10 carbon atoms, more preferably a straight-chain or branched alkyl group having from 1 to 6 carbon atoms, and still more preferably methyl, ethyl, n-propyl, isopropyl, n-butyl, isobutyl, sec-butyl and tert-butyl groups.

Specific examples of the repeating unit represented by formula (6) are set forth below, but the present invention should not be construed as being limited thereto.

[6-1] 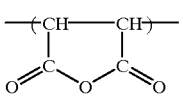

[6-2] 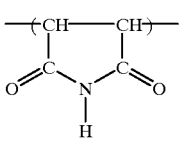

[6-3] 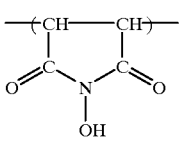

[6-4] 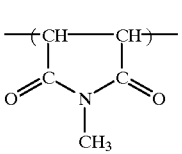

[6-5]
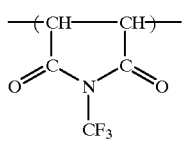

[6-6]
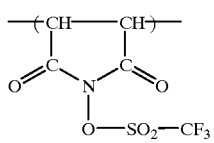

[6-7]
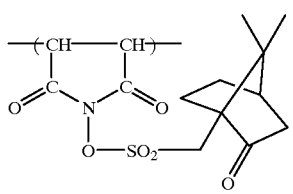

In the acid-decomposable polymer containing a repeating unit represented by formula (4) and at least one of repeating units selected from those represented by formulae (5a) and (5b) for use as the polymer (b) in the second resist layer of the present invention, contents of the repeating unit represented by formula (4) and at least one of the repeating units represented by formulae (5a) and (5b) can be appropriately selected taking resistance to oxygen plasma etching of the resist, adhesion to a substrate, resist performance such as sensitivity, profile and resolution and the like into consideration.

The content of the repeating unit represented by formula (4) is preferably from 10 to 90% by mole, more preferably from 15 to 75% by mole and still more preferably from 20 to 50% by mole. The content of at least one of the repeating units represented by formulae (5a) and (5b) is preferably from 10 to 90% by mole, more preferably from 20 to 80% by mole and still more preferably from 25 to 50% by mole.

Also, in the acid-decomposable polymer containing a repeating unit represented by formula (4), at least one of repeating units selected from those represented by formulae (5a) and (5b) and a repeating unit represented by formula (6) for use in the second resist layer of the present invention, contents of the repeating units can be appropriately selected taking the above-described points into consideration.

In such a case, the content of the repeating unit represented by formula (4) is preferably from 10 to 90% by mole, more preferably from 15 to 70% by mole and still more preferably from 20 to 50% by mole. The content of at least one of the repeating units represented by formulae (5a) and (5b) is preferably from 5 to 50% by mole and more preferably from 10 to 40% by mole. The content of the repeating unit represented by formula (6) is preferably from 10 to 90% by mole, more preferably from 15 to 70% by mol and still more preferably from 20 to 60% by mole.

Now, polymer (b-3) and polymer (b-4) for use in the second resist layer will be described below.

In formula (7), $Y^6$ has the same meaning as defined for $Y^1$ in formula (1).

$L^{21}$ represents a linkage group having a valence of from 2 to 4, and specifically includes an alkylene group which may be substituted, a cycloalkylene group which may be substituted, a phenylene group which may be substituted, an arylene group which may be substituted, an aralkylene group which may be substituted and a combination thereof. Also, a structure of —O—, —COO— or —O(CO)— may be incorporated into the linkage group.

Examples of the substituent include a halogen atom (e.g., chlorine or bromine), a cyano group, a hydroxy group, an amino group, an alkyl group having from 1 to 4 carbon atoms, a cycloalkyl group having from 3 to 8 carbon atoms, an alkoxy group having from 1 to 4 carbon atoms, an aryl group having from 6 to 12 carbon atoms and an aralkyl group having from 7 to 14 carbon atoms.

In a case wherein $L^{21}$ represents a divalent linkage group, $L^{21}$ includes preferably an alkylene group having from 1 to 8 carbon atoms which may be substituted, a phenylene group which may be substituted and a combination thereof and more preferably an alkylene group having from 1 to 6 carbon atoms (e.g., methylene, ethylene, propylene, butylene, —C(CH$_3$)$_2$—CH$_2$— or —C(CH$_3$)$_2$—CH$_2$CH$_2$—).

In a case wherein $L^{21}$ represents a trivalent linkage group, $L^{21}$ includes preferably an alkylene group having from 1 to 10 carbon atoms which may be substituted, a phenylene group which may be substituted and a combination thereof and particularly preferably the following trivalent groups:

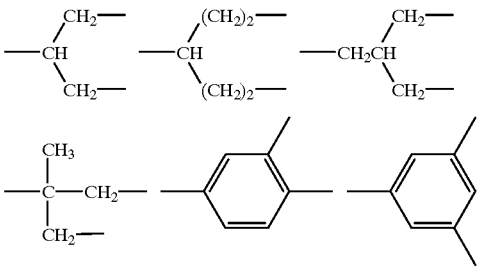

In a case wherein $L^{21}$ represents a tetravalent linkage group, $L^{21}$ includes preferably an alkylene group having from 1 to 10 carbon atoms which may be substituted, a phenylene group which may be substituted and a combination thereof and particularly preferably the following tetravalent groups:

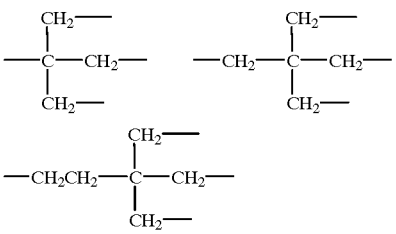

m in formula (7) represents an integer of from 1 to 3.

When the silicon atom is located in the β-position to the ether oxygen in the ester group in the repeating unit represented by formula (7), the repeating unit can also function as an acid-decomposable group. In this case, polymer (b) may or may not contain the repeating unit represented by formula (5a) and/or (5b). In the former case, the polymer (b) corresponds to polymer (b-3).

On the other hand, when silicon atom is located in a position other than the β-position to the ether oxygen in the ester group in the repeating unit represented by formula (7), polymer (b) contains the repeating unit represented by formula (5a) and/or (5b). In such a case, the polymer (b) corresponds to polymer (b-4).

Specific examples of the repeating unit represented by formula (7) are set forth below, but the present invention should not be construed as being limited thereto.

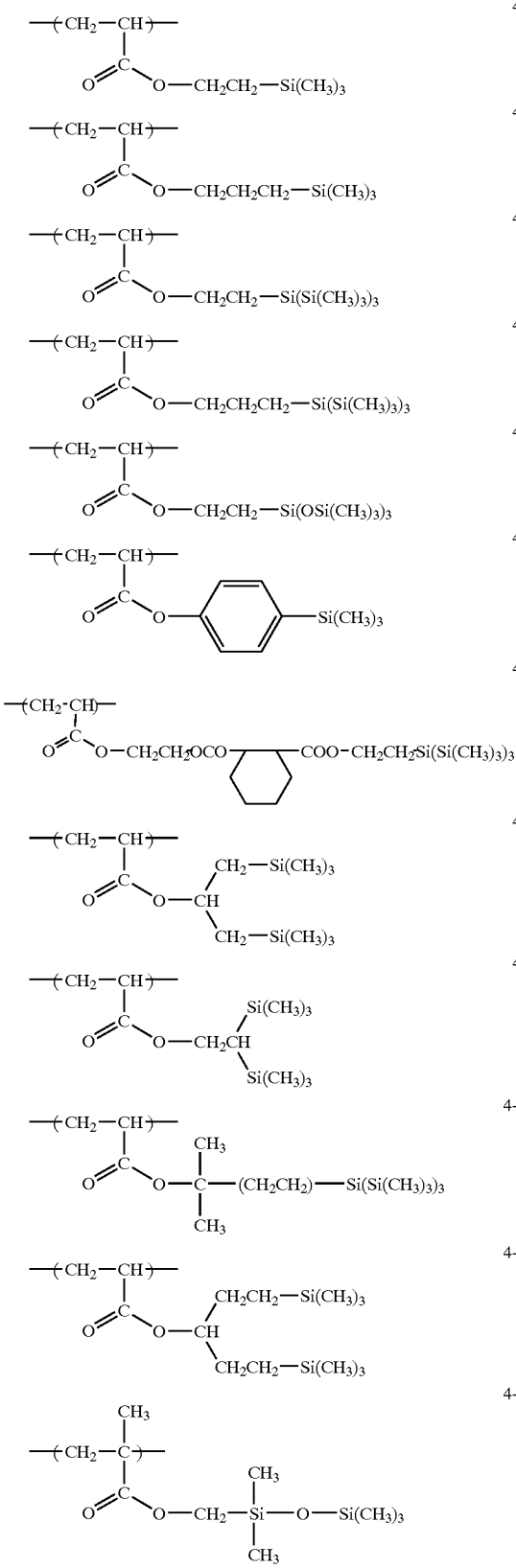

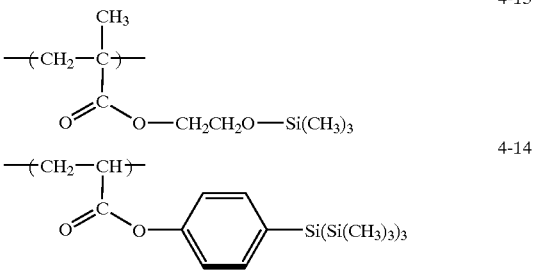

In a case wherein the repeating unit represented by formula (7) also functions as an acid-decomposable group, a content of the repeating unit represented by formula (7) in polymer (b-3) can be appropriately selected taking resistance to oxygen plasma etching of the resist, adhesion of the resist to a substrate, resist performance such as sensitivity, profile and resolution and the like into consideration.

The content of the repeating unit represented by formula (7) is preferably from 10 to 100% by mole, more preferably from 20 to 90% by mole and still more preferably from 25 to 80% by mole.

In a case wherein the repeating unit represented by formula (7) do not function as an acid-decomposable group, a content of the repeating unit represented by formula (7) in polymer (b-4) can be appropriately selected taking the above-described factors into consideration. The content of the repeating unit represented by formula (7) is preferably from 10 to 90% by mole, more preferably from 15 to 70% by mole and still more preferably from 25 to 50% by mole.

A content of at least one of the repeating units represented by formulae (5a) and (5b) is preferably from 10 to 90% by mole and more preferably from 25 to 50% by mole.

The polymer (b-3) or polymer (b-4) used in the present invention may be a copolymer containing one or more other repeating units in addition to the repeating units represented by formulae (5a), (5b) and (7) for the purpose of improving film-forming property, adhesion to a substrate, developing property and the like.

Examples of monomers corresponding to other repeating units include compounds having one addition-polymerizable unsaturated bond, for example, acrylates, methacrylates, acrylamides, methacrylamides, allyl compounds, vinyl ethers and vinyl esters.

More specifically, the above compounds include:
acrylates such as alkyl acrylates (preferably those containing an alkyl group having from 1 to 10 carbon atoms), e.g., methyl acrylate, ethyl acrylate, propyl acrylate, amyl acrylate, cyclohexyl acrylate, ethylhexyl acrylate, octyl acrylate, tert-octyl acrylate, chloroethyl acrylate, trimethylolpropane monoacrylate, pentaerythritol monoacrylate, benzyl acrylate, methoxybenzyl acrylate, furfuryl acrylate and tetrahydrofurfuryl acrylate);

methacrylates such as alkyl methacrylates (preferably those containing an alkyl group having form 1 to 10 carbon atoms), e.g., methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, trimethylolpropane monomethacrylate, pentaerythritol monomethacrylate, furfuryl methacrylate and tetrahydrofurfuryl methacrylate);

acrylamides such as acrylamide, N-alkylacrylamides (the alkyl group of which is an alkyl group having from 1 to 10 carbon atoms, e.g., methyl, ethyl, propyl, butyl, tert-butyl, hepthyl, octyl, cyclohexyl and hydroxyethyl), N,N-dialkylacrylamides (the alkyl group of which is an alkyl group having form 1 to 10 carbon atoms, e.g., methyl, ethyl, butyl, isobutyl, ethylhexyl and cyclohexyl), N-hydroxyethyl-N-methylacrylamide and N-2-acetamidoethyl-N-acetylacrylamide;

methacrylamides such as methacrylamide, N-alkylmethacrylamides (the alkyl group of which is an alkyl group having from 1 to 10 carbon atoms, e.g., methyl, ethyl, tert-butyl, ethylhexyl, hydroxyethyl and cyclohexyl), N,N-dialkylmethacrylamides (the alkyl group of which includes, e.g., ethyl, propyl and butyl) and N-hydroxyethyl-N-methylmethacrylamide;

allyl compounds such as allyl esters (e.g., allyl acetate, allyl caproate, ally caprate, allyl laurate, allyl palmitate, allyl stearate, allyl benzoate, allyl acetoacetate and ally lactate) and allyl oxyethanol;

vinyl ethers such as alkyl vinyl ethers (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether and tetrahydrofurfuryl vinyl ether);

vinyl esters such as vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl acetoacetate, vinyl lactate, vinyl β-phenylbutyrate and vinyl cyclohexylcarboxylate;

dialkyl itaconates (e.g., dimethyl itaconate, diethyl itaconate and dibutyl itaconate);

dialkyl fumarates (e.g., dibutyl fumarate) and monoalkyl fumarates;

acrylic acid, methacrylic acid, crotonic acid, itaconic acid, maleic anhydride, maleimide, acrylonitrile, methacrylonitrile and maleonitrile.

Other addition-polymerizable unsaturated compounds copolymerizable with the above-described repeating units may be employed.

The polymers (b-1), (b-2), (b-3) and (b-4) described above are preferred embodiments of polymer (b).

A weight average molecular weight (measured by GPC and calculated in terms of polystyrene) of polymer (b) for use in the second resist layer of the present invention is not particularly limited, but preferably from 1,000 to 1,000,000, more preferably from 2,000 to 100,000 in view of compatibility with the photo-acid generator of component (c) and other additives, organic solvent aptitude, film-forming property and the like.

The polymers (b) according to the present invention may be used individually or in combination of two or more thereof.

The polymer (b) is used ordinarily from 40 to 99% by weight, preferably from 60 to 98% by weight, based on solid content of the resist composition of the second resist layer.

Specific examples of polymer (b) for use in the second resist layer of the present invention are set forth below, but the present invention should not be construed as being limited thereto. In the following formulae, each numeral attached to the parentheses denotes a molar ratio of the repeating unit.

Resin (1)

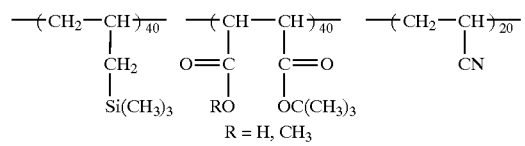

Mw 5600

Resin (2)

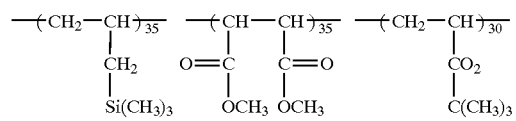

Mw 3600

Resin (3)

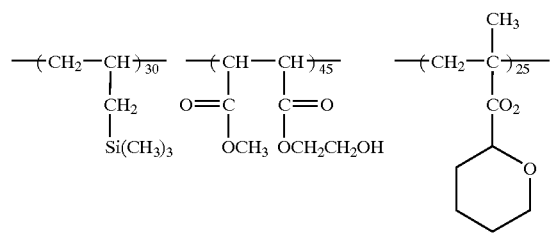

Mw 4800

-continued
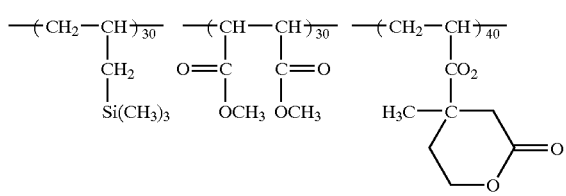
Resin (4)
Mw 3800
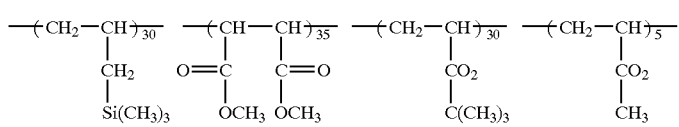
Resin (5)
Mw 3900
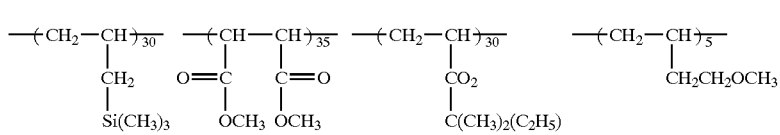
Resin (6)
Mw 5500
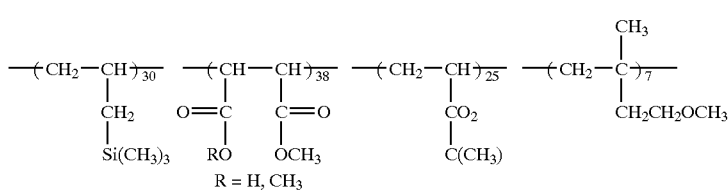
Resin (7)
R = H, CH$_3$
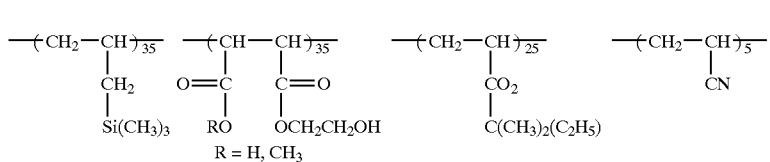
Resin (8)
R = H, CH$_3$
Mw 5300
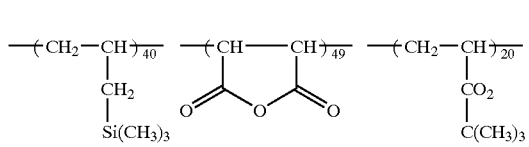
Resin (9)
Mw 5600
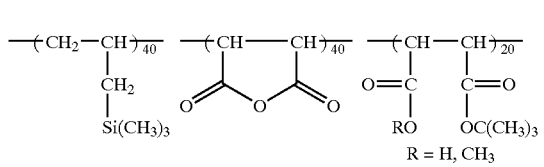
Resin (10)
R = H, CH$_3$
Mw 4300
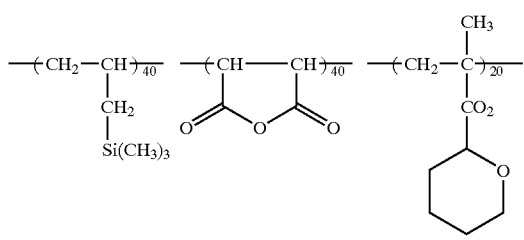
Resin (11)
Mw 4500

Resin (12)
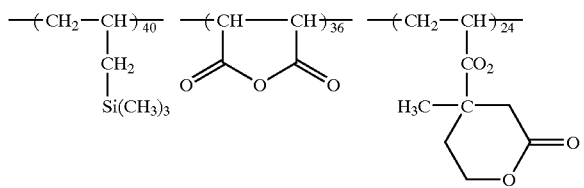
Mw 4100
Resin (13)
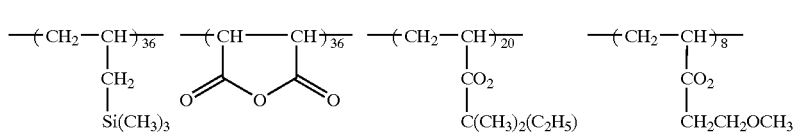
Mw 5200
Resin (14)
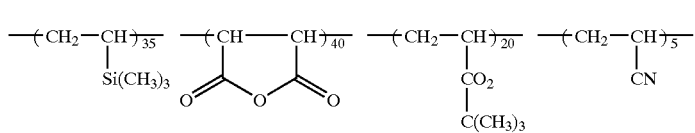
Mw 3400
Resin (15)
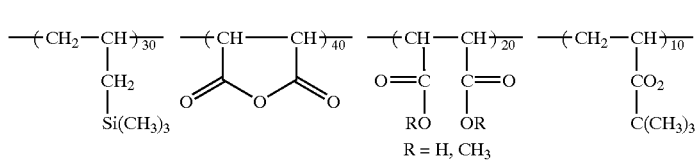
Mw 3600
Resin (16)
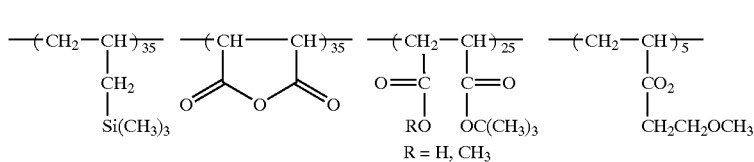
Mw 4100
Resin (17)
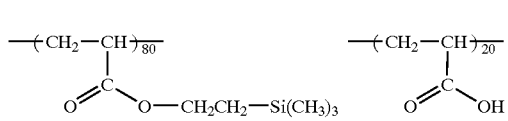
Mw 8500
Resin (18)
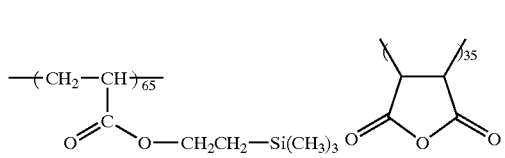
Mw 6400
Resin (19)
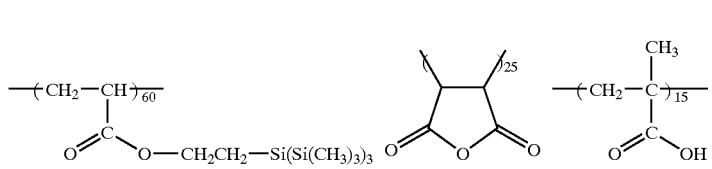
Mw 6900

-continued
Resin (20)
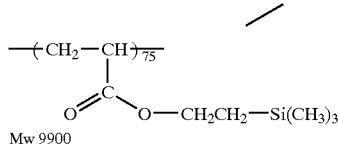
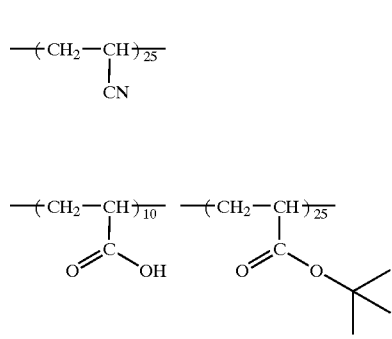
Resin (21)
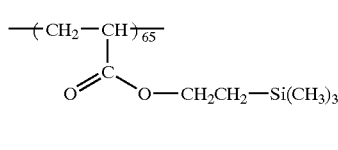
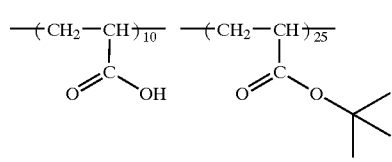
Resin (22)
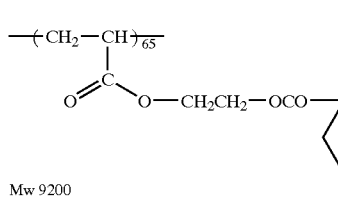
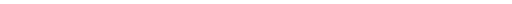
Resin (23)
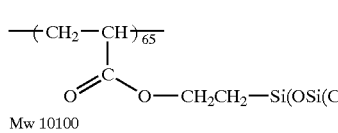
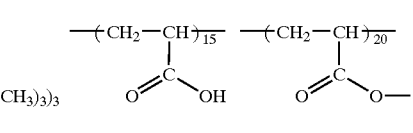
Resin (24)
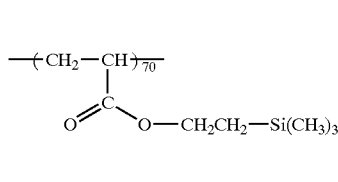
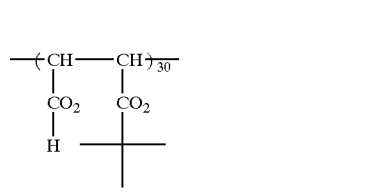
Resin (25)
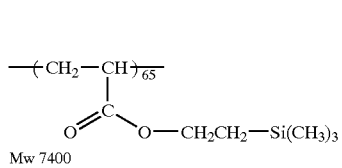
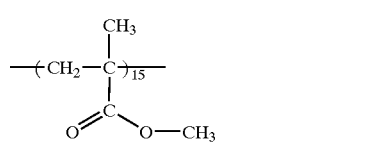
Resin (26)
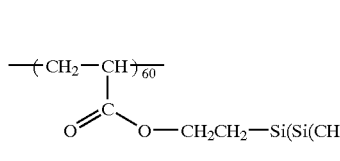
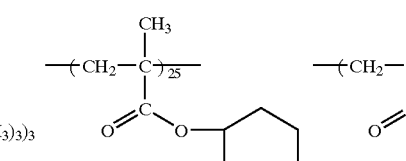
Resin (27)
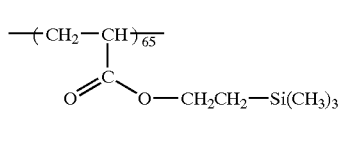
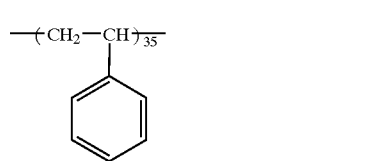

-continued

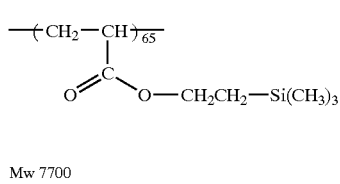
Mw 7700

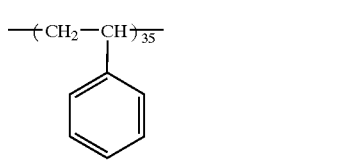

Resin (28)

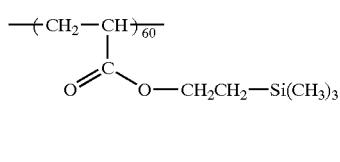
Mw 10200

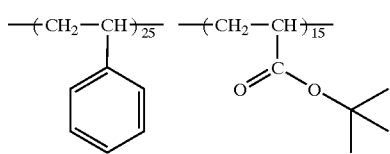

Resin (29)

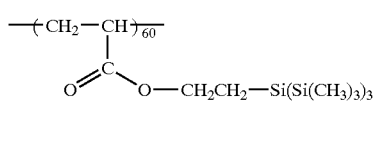
Mw 8800

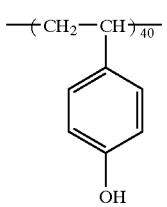

Resin (30)

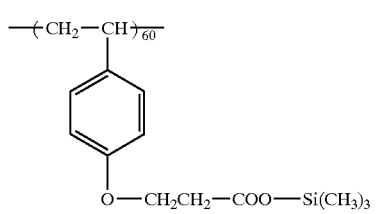
Mw 8300

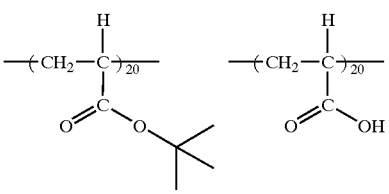

Resin (31)

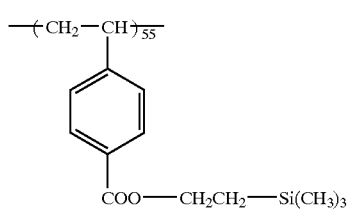
Mw 5400

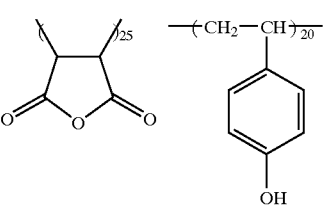

Resin (32)

Now, the compound which generates an acid upon irradiation with an actinic ray or radiation (hereinafter also referred to as "photo-acid generator (c)" as component (c) will be described in more detail below.

The photo-acid generator (c) for use in the second resist layer of the present invention can be appropriately selected from photoinitiators for photo-cation polymerization, photoinitiators for photo-radical polymerization, photo-achromatizing agents for dyes, photo-discoloring agents, compounds which generate an acid by known light used in a microresist or the like (an ultraviolet ray or far ultraviolet ray of from 400 to 200 nm, particularly preferably, a g-line, h-line, i-line or KrF excimer laser beam), an ArF excimer laser beam, an electron beam, an X ray, a molecular beam or an ion beam, and a mixture of these compounds.

Other examples of the photo-acid generator (c) for use in the second resist layer of the present invention include onium salts such as diazonium salts, ammonium salts, phosphonium salts, iodonium salts, sulfonium salts, selenonium salts, arsonium salts, organic halogeno-compounds, organo-metals/organic halogenides, photo-acid generators having o-nitrobenzyl type protective groups, compounds generating a sulfonic acid on photolysis which are represented by iminosulfonates, disulfone compounds, diazoketosulfone compounds and diazodisulfone compounds.

Further, polymers containing the above-described groups or compounds that can generate acids upon exposure to light introduced into the main chain or side chain thereof can be used.

In addition, the compounds capable of generating acids upon exposure to light as described, e.g., in V. N. R. Pillai, *Synthesis*, (1), 1 (1980), A. Abad et al., *Tetrahedron Lett.*, (47) 4555 (1971), D. H. R. Barton et al., *J. Chem. Soc.*, (C), 329 (1970), U.S. Pat. No. 3,779,778 and European Patent 126,712 can also be used.

Of the photo-acid generators (c) described above, those which can be particularly effectively used in the present invention include (c-1) to (c-4) described below.

(c-1) Oxazole derivative substituted with a trihalomethyl group represented by formula (PAG1) shown below or s-triazine derivative substituted with a trihalomethyl group represented by formula (PAG2) shown below:

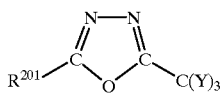

(PAG1)

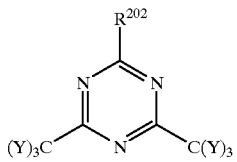

(PAG2)

wherein $R^{201}$ represents a substituted or unsubstituted aryl group or a substituted or unsubstituted alkenyl group; $R^{202}$ represents a substituted or unsubstituted aryl group, a substituted or unsubstituted alkenyl group, a substituted or unsubstituted alkyl group or —C(Y)$_3$; and Y represents a chlorine atom or a bromine atom.

Specific examples thereof include the following compounds, however, the present invention should not be construed as being limited thereto.

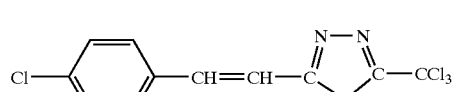

(PAG1-1)

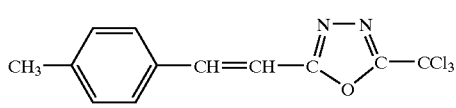

(PAG1-2)

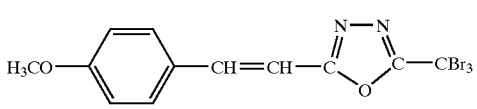

(PAG1-3)

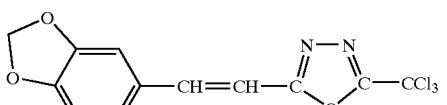

(PAG1-4)

(PAG1-5)

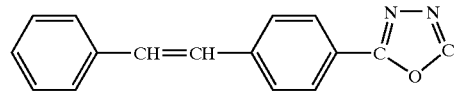

(PAG1-6)

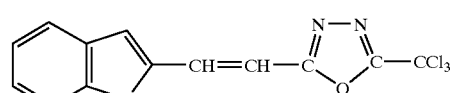

(PAG1-7)

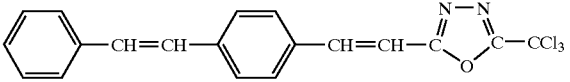

(PAG1-8)

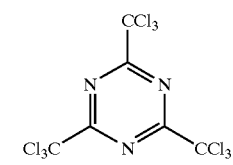

(PAG2-1)

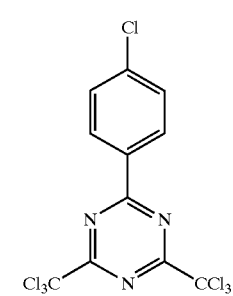

(PAG2-2)

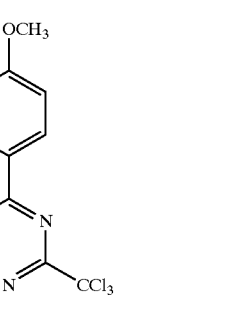

(PAG2-3)

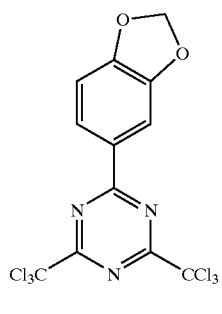

(PAG2-4)

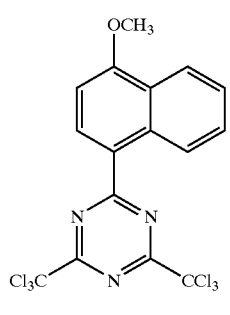

(PAG2-5)

-continued (PAG2-6)
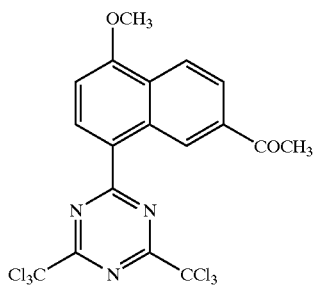

(PAG2-7)
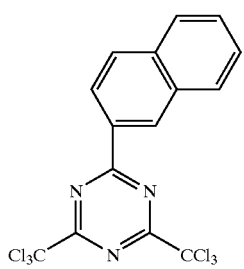

(PAG2-8)
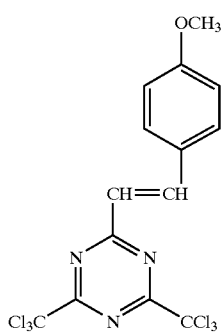

(PAG2-9)
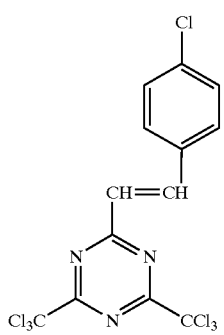

(PAG3-1)
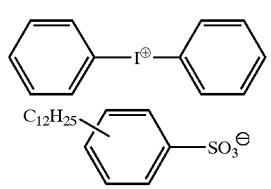

-continued (PAG2-10)
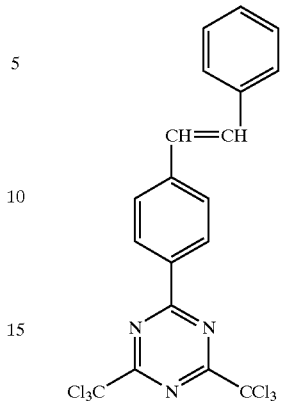

(c-2) Iodonium salt represented by formula (PAG3) shown below or sulfonium salt represented by formula (PAG4) shown below:

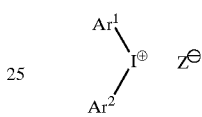 (PAG3)

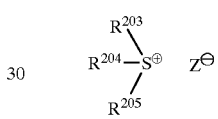 (PAG4)

wherein $Ar^1$ and $Ar^2$, which may be the same or different, each represents a substituted or unsubstituted aryl group; $R^{203}$, $R^{204}$ and $R^{205}$, which may be the same or different, each represents a substituted or unsubstituted alkyl group or a substituted or unsubstituted aryl group and $Z^-$ represents a counter anion.

Examples of the counter anion include $BF_4^-$, $AsF_6^-$, $PF_6^-$, $SbF_6^-$, $SiF_6^{2-}$, $ClO_4^-$, a perfluoroalkane sulfonate anion such as $CF_3SO_3^-$, an alkylsulsonate anion such as camphorsulfonate anion, an aromatic sulfonate anion such as pentafluorobenzene sulfonate anion, benzenesulfonate anion or triisopropylbenzenesulfonate anion, a condensed polynuclear aromatic sulfonate anion such as naphthalene-1-sulfonate anion, anthraquinone sulfonate anion and a sulfonic acid group-containing dye, however, the present invention should not be construed as being limited thereto. The anion may further be substituted.

Alternatively, two of $R^{203}$, $R^{204}$ and $R^{205}$ or $Ar^1$ and $Ar^2$ may be combined through a single bond or a substituent.

Specific examples thereof include the following compounds, however, the present invention should not be construed as being limited thereto.

(PAG3-2)
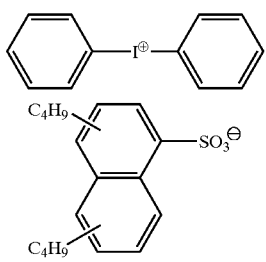

-continued
(PAG3-3) 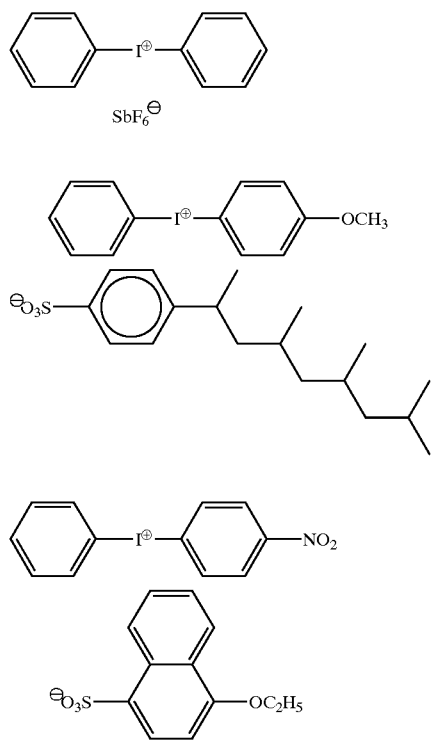 (PAG3-4) 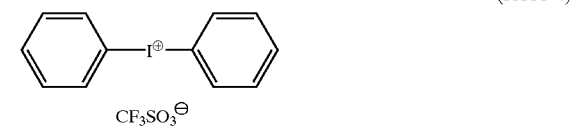
(PAG3-5) (PAG3-6) 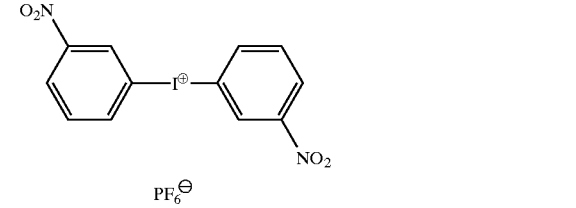
(PAG3-7) (PAG3-8) 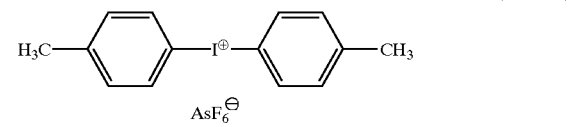
(PAG3-9) 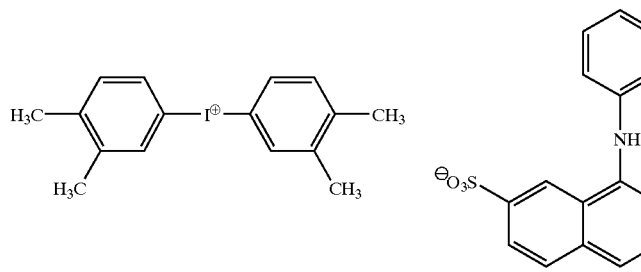
(PAG3-10) 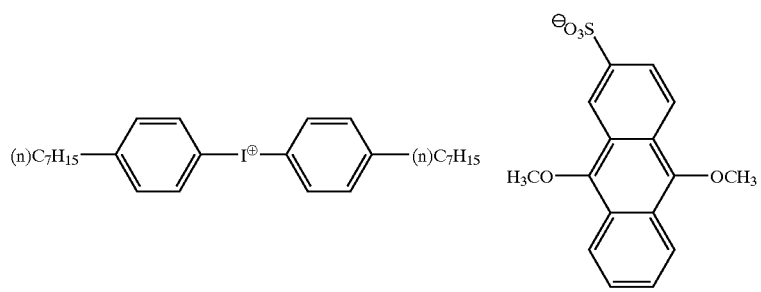
(PAG3-11) 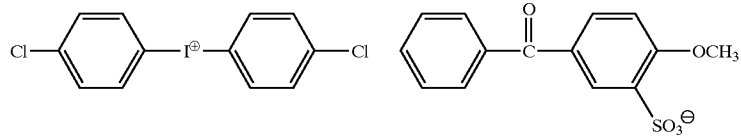
(PAG3-1.25) 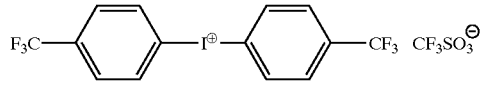

-continued
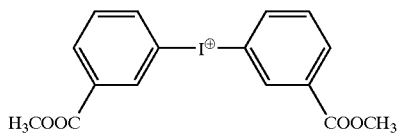 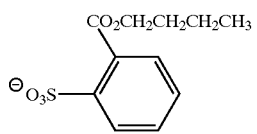
(PAG3-13)
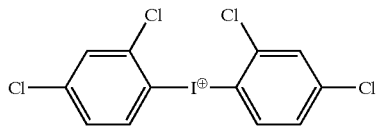 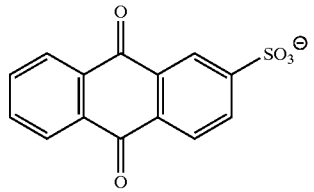
(PAG3-14)
(PAG3-15) (PAG3-16)
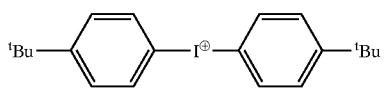 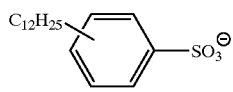  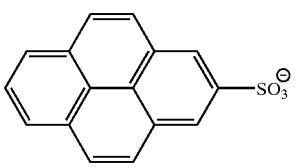
(PAG3-17) (PAG3-18)
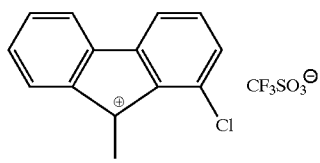 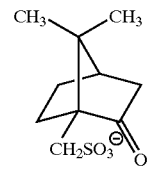
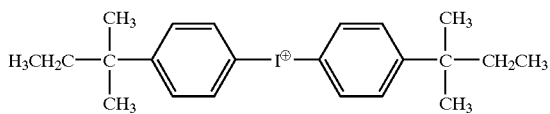 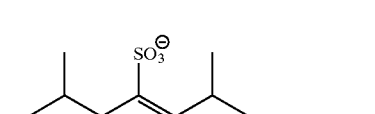
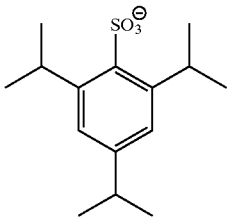
(PAG3-19)
(PAG3-20) (PAG3-21)
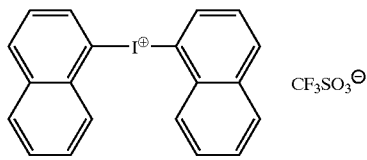 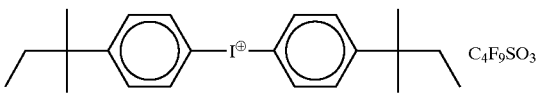
(PAG3-22) (PAG3-23)
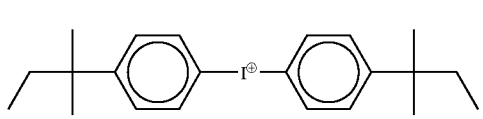 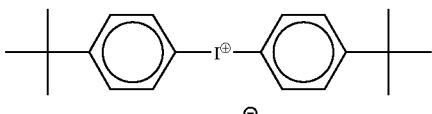
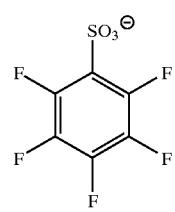

(PAG3-24)
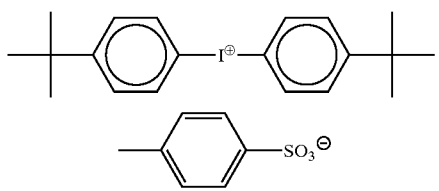
(PAG3-25)
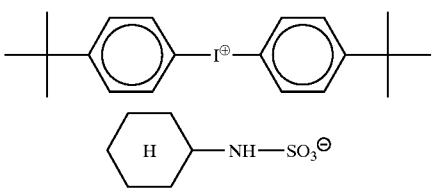
(PAG4-1)
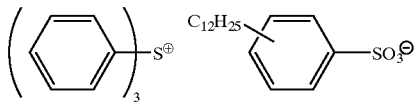
(PAG4-2)
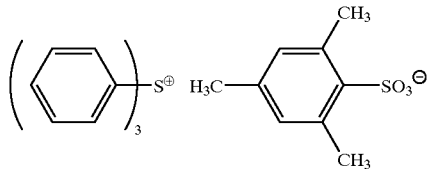
(PAG4-3)
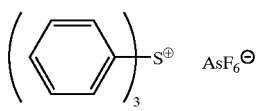
(PAG4-4)
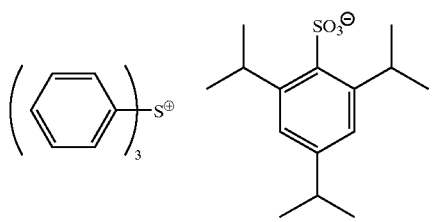
(PAG4-5)
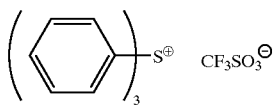
(PAG4-6)
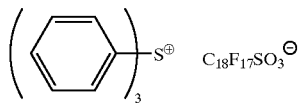
(PAG4-7)
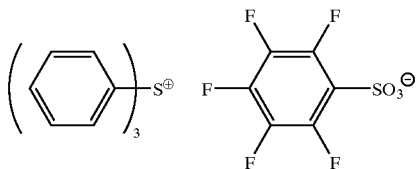
(PAG4-8)
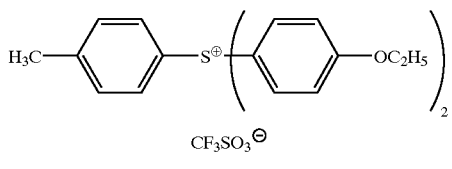
(PAG4-9)
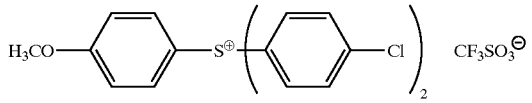
(PAG4-10)
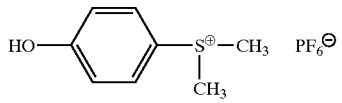
(PAG4-11)
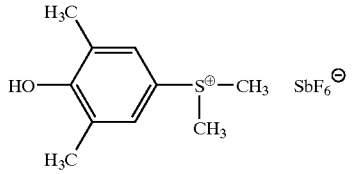
(PAG4-12)
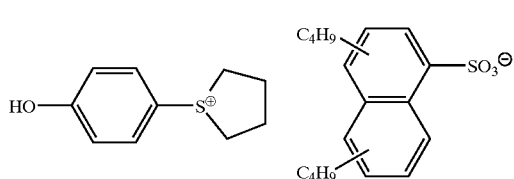
(PAG4-13)
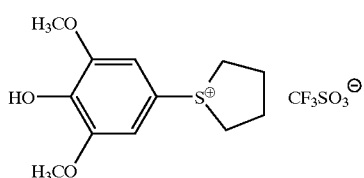
(PAG4-14)
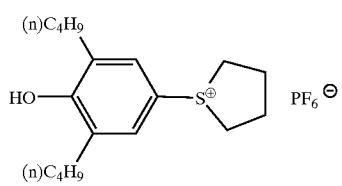

(PAG4-15)
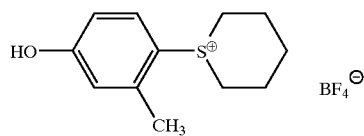
(PAG4-16)
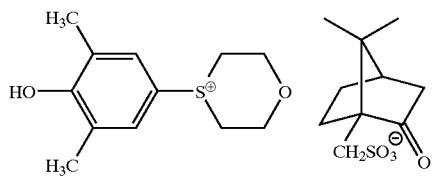
(PAG4-17)
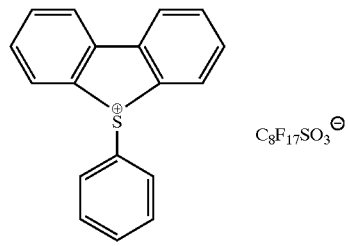
(PAG4-18)
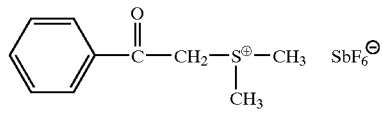
(PAG4-19)
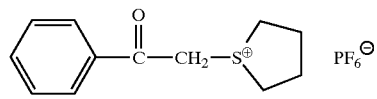
(PAG4-20)
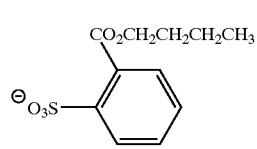
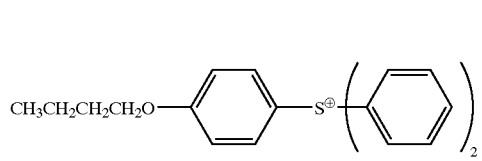
(PAG4-21)
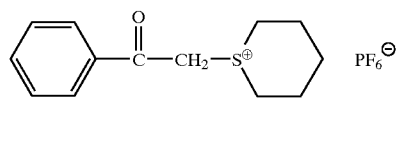
(PAG4-22)
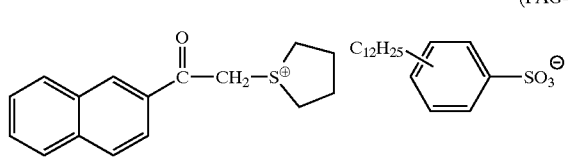
(PAG4-23)
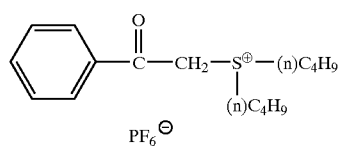
(PAG4-24)
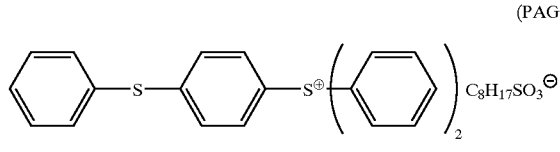
(PAG4-25)
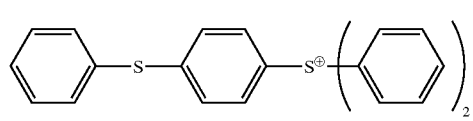
(PAG4-26)
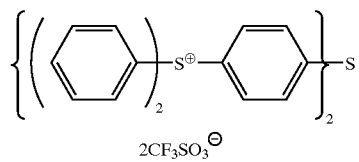
(PAG4-27)
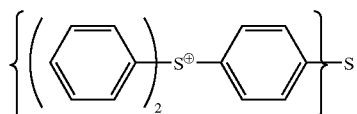
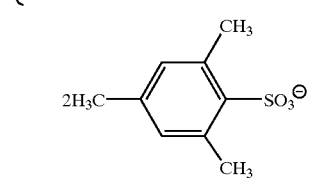

-continued

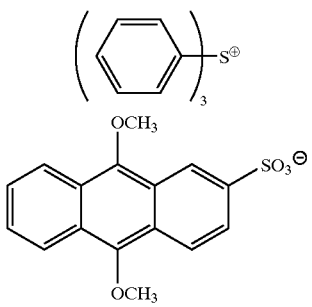
(PAG4-28)

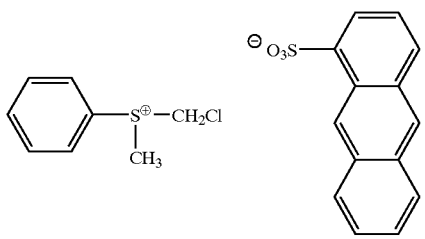
(PAG4-29) (PAG4-30) (PAG4-31)

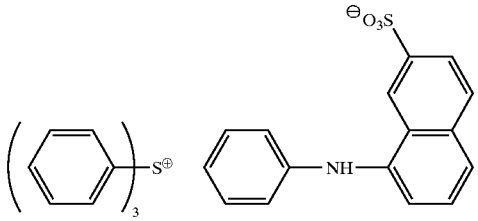
(PAG4-32) (PAG4-33)

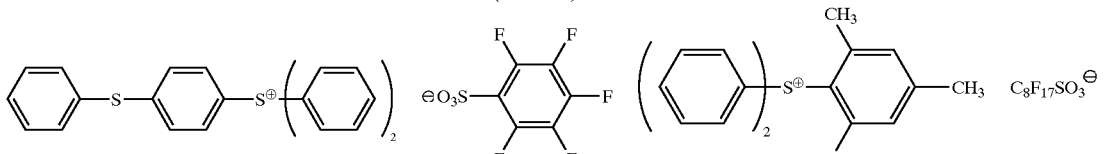
(PAG4-34) (PAG4-35)

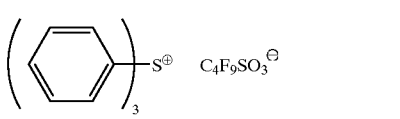
(PAG4-36)

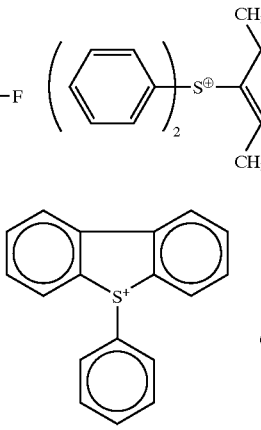
(PAG4-37)

The onium salts represented by formulae (PAG3) and (PAG4) are known and can be synthesized by the methods described, for example, in J. W. Knapczyk et al., *J. Am. Chem. Soc.*, 91, 145 (1969), A. L. Maycok et al., *J. Org. Chem.*, 35, 2532 (1970), E. Goethas et al., *Bull. Soc. Chem. Belg.*, 73, 546 (1964), H. M. Leicester, *J. Ame. Chem. Soc.*, 51, 3587 (1929), J. V. Crivello et al., *J. Polym. Chem. Ed.*, 18, 2677 (1980), U.S. Pat. Nos. 2,807,648 and 4,247,473 and JPA-53-101331.

(c3) Disulfone derivative represented by formula (PAG5) shown below or iminosulfonate derivative represented by formula (PAG6) shown below:

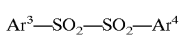
(PAG5)

(PAG6)

wherein $Ar^3$ and $Ar^4$, which may be the same or different, each represents a substituted or unsubstituted aryl group; $R^{206}$ represents a substituted or unsubstituted alkyl group or a substituted or unsubstituted aryl group; and A represents a substituted or unsubstituted alkylene group, a substituted or unsubstituted alkenylene group or a substituted or unsubstituted arylene group.

Specific examples thereof include the following compounds, however, the present invention should not be construed as being limited thereto.
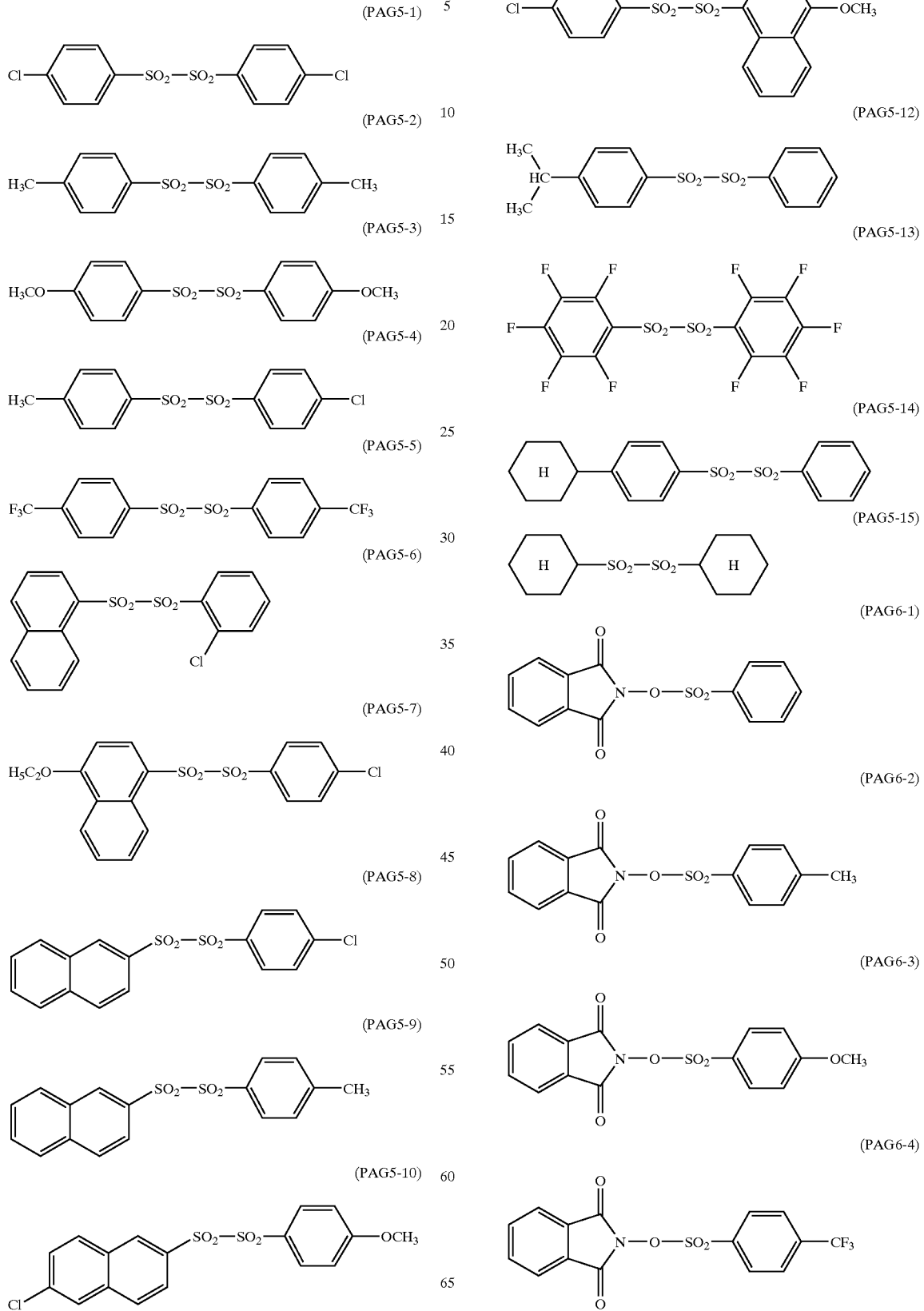

(PAG6-5)
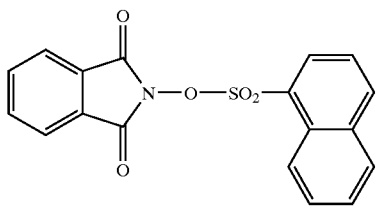
(PAG6-6)
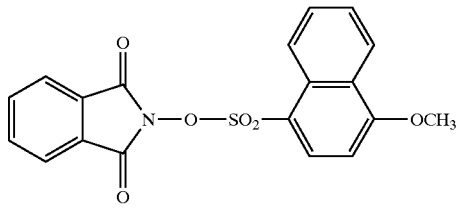
(PAG6-7)
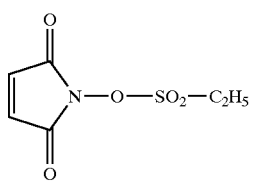
(PAG6-8)
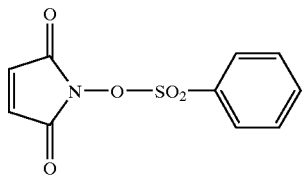
(PAG6-9)
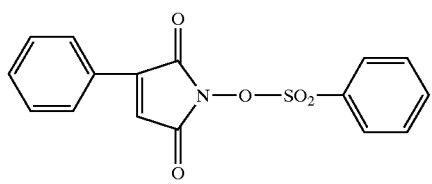
(PAG6-10)
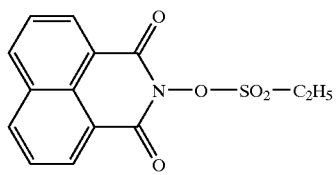
(PAG6-11)
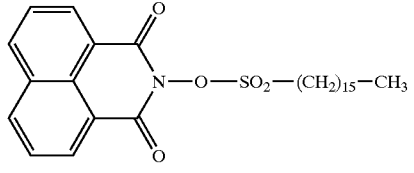
(PAG6-12)
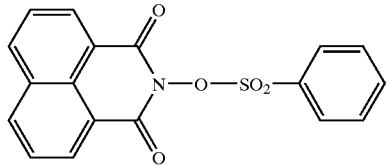
(PAG6-13)
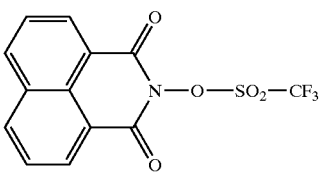
(PAG6-14)
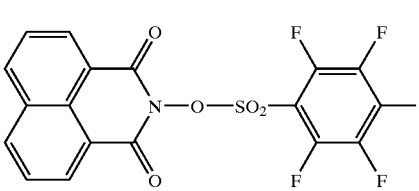
(PAG6-15)
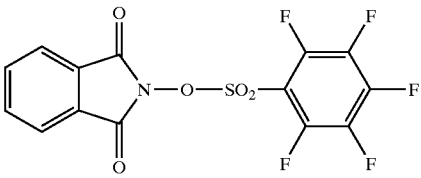
(PAG6-16)
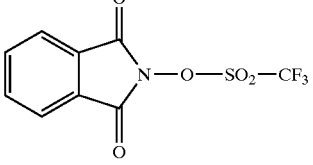
(PAG6-17)
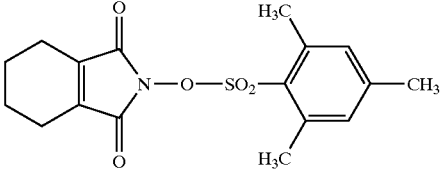
(PAG6-18)
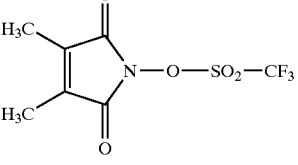
(PAG6-19)
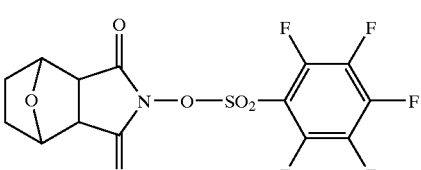
(PAG6-20)
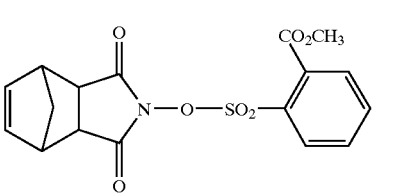

(c-4) Diazodisulfone derivative represented by formula (PAG7) shown below:

(PAG7)

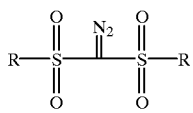

wherein R represents a straight-chain, branched or cyclic alkyl group or a substituted or unsubstituted aryl group.

Specific examples thereof include the following compounds, however, the present invention should not be construed as being limited thereto.

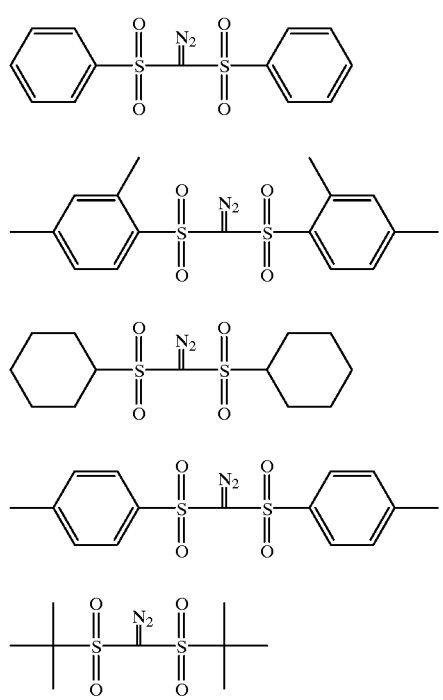

(PAG7-1)

(PAG7-2)

(PAG7-3)

(PAG7-4)

(PAG7-5)

An amount of the photo-acid generator (c) to be used in the second resist layer is usually from 0.001 to 40% by weight, preferably from 0.01 to 20% by weight, and more preferably from 0.1 to 10% by weight, based on solid content of the resist composition. If the amount of the photo-acid generator used is less than 0.001% by weight, sensitivity of the resist composition decreases, whereas if the amount used exceeds 40% by weight, the resist absorbs too much light, resulting in causing disadvantageous problem such as deterioration of profile or narrowing of process margin and thus, both cases are not preferred.

It is preferred that the second resist layer of the positive resist laminate of the present invention further contains an organic basic compound as an acid-scavenger. The organic basic compound which is used in the present invention is preferably a compound which has basicity stronger than phenol. Particularly, a nitrogen-containing basic compound having a structure represented by formula (A), (B), (C), (D) or (E) shown below is preferably used.

By the use of the nitrogen-containing basic compound, change in characteristics of the resist composition with the lapse of time from exposure to post-baking is restrained.

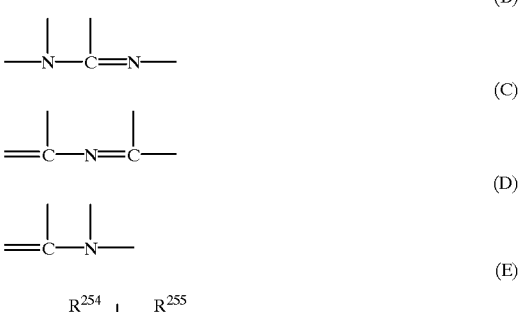

(A)

(B)

(C)

(D)

(E)

wherein $R^{250}$, $R^{251}$ and $R^{252}$, which may be the same or different, each represents a hydrogen atom, an alkyl group having from 1 to 6 carbon atoms, an aminoalkyl group having from 1 to 6 carbon atoms, a hydroxyalkyl group having from 1 to 6 carbon atoms or a substituted or unsubstituted aryl group having from 6 to 20 carbons atoms, or $R^{251}$ and $R^{252}$ may be combined with each other to form a ring;

wherein $R^{253}$, $R^{254}$, $R^{255}$ and $R^{256}$, which may be the same or different, each represents an alkyl group having from 1 to 6 carbon atoms.

More preferred organic basic compound is a nitrogen-containing cyclic compound or a nitrogen-containing basic compound having two or more nitrogen atoms of different chemical environment in its molecule.

The nitrogen-containing cyclic compound preferably has a polycyclic structure. Specific examples of preferred nitrogen-containing polycyclic compound include those represented by formula (VI) shown below.

(VI)

wherein Y and W, which may be the same or different, each represents a straight-chain, branched or cyclic alkylene group which may contain a hetero atom or may be substituted.

Examples of the hetero atom includes a nitrogen atom, a sulfur atom and an oxygen atom. The alkylene group preferably has from 2 to 10 carbon atoms, more preferably from 2 to 5 carbon atoms. Examples of the substituent for the alkylene group include an alkyl group having from 1 to 6 carbon atoms, an aryl group, an alkenyl group, a halogen atom and a halogen-substituted alkyl group.

Specific examples of the compound represented by formula (VI) are set forth below, but the present invention should not be construed as being limited thereto.

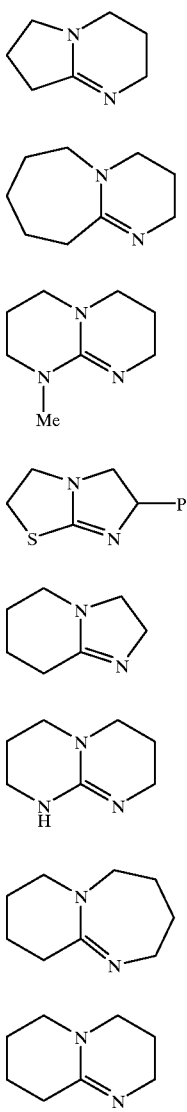

Particularly preferred examples of the compound represented by formula (VI) are 1,8-diazabicyclo[5.4.0]undec-7-ene and 1,5-diazabicyclo[4.3.0]non-5-ene.

Of the nitrogen-containing basic compounds having two or more nitrogen atoms of different chemical environment in their molecules, those particularly preferred include a compound containing both a substituted or unsubstituted amino group and a ring structure having a nitrogen atom and a compound having an alkylamino group. Preferred specific examples thereof include a substituted or unsubstituted guanidine, a substituted or unsubstituted aminopyridine, a substituted or unsubstituted aminoalkylpyridine, a substituted or unsubstituted aminopyrrolidine, a substituted or unsubstituted indazole, a substituted or unsubstituted pyrazole, a substituted or unsubstituted pyrazine, a substituted or unsubstituted pyrimidine, a substituted or unsubstituted purine, a substituted or unsubstituted imidazoline, a substituted or unsubstituted pyrazoline, a substituted or unsubstituted piperazine, a substituted or unsubstituted aminomorpholine and a substituted or unsubstituted aminoalkylmorpholine. Preferred examples of the substituent include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxy group and a cyano group.

Particularly preferred examples of the compound include guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl) pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl) pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, N-(2-aminoethyl) morpholine, trimethylimidazole, triphenylimidazole and methyldiphenylimidazole. However, the present invention should not be construed as being limited thereto.

The nitrogen-containing basic compounds are used individually or in combination of two or more thereof in the present invention. An amount of the nitrogen-containing basic compound used is ordinarily from 0.001 to 10 parts by weight, preferably from 0.01 to 5 parts by weight, based on 100 parts by weight of solid content of the photoresist composition of the second resist layer. If the amount is less than 0.001 part by weight, the effect of the nitrogen-containing basic compound added is not obtained. On the other hand, if the amount exceeds 10 parts by weight, reduction in sensitivity or deterioration of developing property of the unexposed area is liable to occur.

Now, a solvent is described in detail below. Preferred examples of the solvent for use in the production of the second resist layer of the positive resist laminate according to the present invention include ethylene glycol monoethyl ether acetate, cyclohexanone, 2-heptanone, propylene glycol monomethyl ether, propylene glycol monomethyl ether acetate, propylene glycol monomethyl ether propionate, propylene glycol monoethyl ether acetate, methyl 3-methoxypropionate, ethyl 3-ethoxypropionate, methyl β-methoxyisobutyrate, ethyl butyrate, propyl butyrate, methyl isobutyl ketone, ethyl acetate, isoamyl acetate, ethyl lactate, toluene, xylene, cyclohexyl acetate, diacetone alcohol, N-methylpyrrolidone, N,N-dimethylformamide, γ-butyrolactone, N,N-dimethylacetamide, propylene carbonate and ethylene carbonate.

The solvents may be used individually or in combination of two or more thereof. It is important to select the solvent since it has influence on the solubility of each component for the second resist layer, coating aptitude on the first resist layer and preservation stability of the resist composition. Also, it is preferred that the moisture content in the solvent used is as low as possible since water adversely affects various resist characteristics.

The respective components constituting each layer of the positive resist laminate of the present invention are dissolved in an appropriate solvent so as to make a coating solution having a solid component concentration of preferably from 3 to 40% by weight, more preferably from 5 to 30% by weight and still more preferably from 7 to 20% by weight.

It is preferred to reduce a impurity component, for example, a metallic impurity such as metal and a chlorine ion in an amount of not more than 100 ppb in the coating solution thus-prepared. If a large amount of the impurity is present in the coating solution, a problem such as inferior behavior, defect or decrease of yield in the production of semiconductor device disadvantageously tends to occur.

The coating solution is preferably used after filtering through a filter, for example, a filter having a pore size of from about 0.05 μm to about 0.2 μm in order to remove extraneous substances.

The respective layers of the positive resist laminate according to the present invention may further contain, if desired, a surfactant, an acid-decomposable dissolution-inhibiting compound, a dye, a plasticizer, a photosensitizer, a crosslinking agent, a photo-base generator, a heat-base generator, a spectral sensitizer, a compound which accelerates solubility in a developing solution, a compound (photo-base) which decreases basicity upon exposure and the like.

Preferred examples of the surfactant for use in the positive resist laminate of the present invention include (e) a surfactant containing at least one of fluorine atom and silicon atom. Specifically, fluorine-containing base surfactants, silicon-containing surfactants, surfactants having both a fluorine atom and a silicon atom are employed individually or in combination of to or more thereof.

Suitable examples of (e) the surfactant include those described, for example, in JP-A-62-36663, JP-A-61-226746, JP-A-61-226745, JP-A-62-170950, JP-A-63-34540, JP-A-7-230165, JP-A-8-62834, JP-A-9-54432 and JP-A-9-5988. Commercially available surfactants are also employed as they are.

Examples of commercially available surfactant which can be used include a surfactant containing at least one of fluorine atom and silicon atom, for example, Eftop EF301 and EF303 (manufactured by Shin-Akita Kasei K. K.), Florad FC430 and FC431 (manufactured by Sumitomo 3M Inc.), Megafac F171, F173, F176, F189 and R08 (manufactured by Dainippon Ink and Chemicals, Inc.), Surflon S-382, SC101, SC102, SC103, SC104, SC105 and SC106 (manufactured by Asahi Glass Co., Ltd.), and Troysol S-366 (manufactured by Troy Chemical Industry Inc.). Also, polysiloxane polymer KP-341 (manufactured by Shin-Etsu Chemical Industry Co., Ltd.) is employed as the silicon-containing surfactant.

An amount of such a surfactant used is ordinarily from 0.001 to 2% by weight, preferably from 0.01 to 1% by weight, based on solid content of the resist composition of the respective layers of the positive resist laminate according to the present invention. The surfactants may be used individually or in combination of two or more thereof.

A surfactant other than the surfactant containing at least one of fluorine atom and silicon atom described above may be used. Specific examples of such surfactant which can be used include a nonionic surfactant, for example, a polyoxyethylene alkyl ether such as polyoxyethylene lauryl ether, polyoxyethylene stearyl ether, polyoxyethylene cetyl ether or polyoxyethylene oleyl ether, a polyoxyethylene alkylaryl ether such as polyoxyethylene octylphenyl ether or polyoxyethylene nonylphenyl ether, a polyoxyethylene/polyoxypropylene block copolymer, a sorbitan fatty acid ester such as sorbitan monolaurate, sorbitan monopalmitate, sorbitan monostearate, sorbitan monooleate, sorbitan trioleate or sorbitan tristearate, and a polyoxyethylene sorbitan fatty acid ester such as polyoxyethylene sorbitan monolaurate, polyoxyethylene sorbitan monopalmitate, polyoxyethylene sorbitan monostearate, polyoxyethylene sorbitan trioleate or polyoxyethylene sorbitan tristearate.

An amount of the surfactant other than the fluorine-base and/or silicon-base surfactant used is ordinarily not more than 2 parts by weight, preferably not more than 1 part by weight, based on 100 parts by weight of solid content of the resist composition of the respective layers.

The acid-decomposable dissolution-inhibiting compound which can be used in the positive resist laminate of the present invention includes low molecular weight acid-decomposable dissolution-inhibiting compounds as described, for example, in JP-A-5-134415 and JP-A-6-51519.

The plasticizer which can be used in the positive resist laminate of the present invention includes compounds as described, for example, in JP-A-4-212960, JP-A-8-262720, European Patents 735,422, 416,873 and 439,371 and U.S. Pat. No. 5,846,690. Specific examples thereof include di(2-ethylhexyl) adipate, n-hexyl benzoate, di(n-octyl) phthalate, di(n-butyl) phthalate, benzyl n-butyl phthalate and dihydroabietyl phthalate.

The compound which accelerates solubility in a developing solution for use in the positive resist laminate of the present invention includes polyhydroxy compounds as described, for example, in JP-A-4-134345, JP-A-4-217251, JP-A-7-181680, JP-A-8-211597, U.S. Pat. Nos. 5,688,628 and 5,972,559. An aromatic polyhydroxy compound, for example, 1,1-bis(4-hydroxyphenyl)cyclohexane, 4,4-(α-methylbenzylidene) bisphenol, α,α',α"-tris(4-hydroxyphenyl)-1,3,5-triisopropylbenzene, α, α', α"-tris(4-hydroxyphenyl)-1-ethyl-4-isopropylbenzene, 1,2,2-tris(4-hydroxyphenyl) propane, 1,1,2-tris(3,5-dimethyl-4-hydroxyphenyl) propane, 2,2,5,5-tetrakis(4-hydroxyphenyl) hexane, 1,2-bis(4-hydroxyphenyl)ethane, 1,3,3-tris(4-hydroxyphenyl)butane or para [α,α,α',α'-tetrakis (4-hydroxyphenyl)]xylene is preferably used. Also, an organic acid, for example, salicylic acid, diphenolic acid or phenolphthalane can be used. Further, a sulfonamide compound as described in JP-A-5-181263 and JP-A-7-92680, a carboxylic acid and carboxylic acid anhydride as described in JP-A-4-248554 and JP-A-5-181279 and JP-A-7-92679, and an alkali-soluble resin such as a polyhydroxystylene resin as described in JP-A-11-153869 are also used.

The dye suitably used in the present invention include an oil dye and a basic dye. Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 (all are manufactured by Orient Chemical Industries Co., Ltd.), Crystal Violet (CI42555), Methyl Violet (CI42535), Rhodamine B (CI45170B), Malachite Green (CI42000) and Methylene Blue (CI52015).

Further, to the positive resist laminate of the present invention may added an ammonium salt as described, for example, in JP-A-7-28247, European Patent 616,258, U.S. Pat. No. 5,525,443, JP-A-9-127700, European Patent 762,207 and U.S. Pat. No. 5,783,354, and including specifically tetramethyl ammonium hydroxide, tetra-n-butyl ammonium hydroxide and betaine. Moreover, a compound (photo-base) which decreases basicity upon exposure as described, for example, in JP-A-5-232706, JP-A-6-11835, JP-A-6-242606, JP-A-6-266100, JP-A-7-333851, JP-A-7-333844, U.S. Pat. No. 5,663,035 and European Patent 677,788 may be added.

Furthermore, a spectral sensitizer as described below is added to the second resist layer of the positive resist laminate of the present invention to sensitize in a wavelength region longer than far ultraviolet in which the acid-generator used does not have absorption, thereby providing with sensitivity to an i-line or a g-line. Specific examples of suitable spectral sensitizer include benzophenone, p,p'-tetramethyldiaminobenzophenone, p,p'-tetraethylethylaminobenzophenone, 2-chlorothioxanthone, anthrone, 9-ethoxyanthracene, anthracene, pyrene, perylene, phenothiazine, benzil, Acridine Orange, benzoflavin, Setoflavin-T, 9,10-diphenylanthracene, 9-fluorenone, acetophenone, phenanthrene, 2-nitrofluorene, 5-nitroacenaphthene, benzoquinone, 2-chloro-4-nitroaniline, N-acetyl-p-nitroaniline, p-nitroaniline, N-acetyl-4-nitro-1-naphthylamine, picramide, anthraquinone, 2-ethylanthraquinone, 2-tert-butylanthraquinone, 1,2-benzanthraquinone, 3-methyl-1,3-diaza-1,9-benzanthrone, dibenzalacetone, 1,2-naphthoquinone, 3,3'-carbonyl-bis(5,7-dimethoxycarbonylcoumarin) and coronene. However, the present invention should not be construed as being limited thereto.

The spectral sensitizer may also be used as a light absorbent of far ultraviolet ray from a light source. In this case, the light absorbent reduces reflected light from a substrate and decreases the influence of multiple reflection in the resist layer, thereby reducing the standing wave.

The photo-base generator which can be added to the positive resist laminate of the present invention includes compounds as described, for example, in JP-A-4-151156, JP-A-4-162040, JP-A-5-197148, JP-A-5-5995, JP-A-6-194834, JP-A-8-146608, JP-A-10-83079 and European Patent 622,682. Specific examples of the photo-base generator preferably used include 2-nitrobenzylcarbamate, 2,5-dinitrobenzylcyclohexylcarbamate, N-cyclohexyl-4-methylphenylsulfonamide and 1,1-dimethyl-2-phenylethyl-N-isopropylcarbamate. The photo-base generator is used, for example, for the purpose of improving resist profile.

The heat-base generator for use in the positive resist laminate of the present invention includes compounds as described, for example, in JP-A-5-158242, JP-A-5-158239 and U.S. Pat. No. 5,576,143.

As a developing solution for the second resist layer used in the present invention, an aqueous solution of alkali, including, for example, an inorganic alkali, e.g., sodium hydroxide, potassium hydroxide, sodium carbonate, sodium silicate, sodium metasilicate or aqueous ammonia, a primary amine, e.g., ethylamine or n-propylamine, a secondary amine, e.g., diethylamine or di-n-butylamine, a tertiary amine, e.g., triethylamine or methyldiethylamine, an alcoholamine, e.g., dimethylethanolamine or triethanolamine, a quaternary ammonium salt, e.g., tetramethylammonium hydroixde and tetraethylammonium hydroixde, and a cyclic amine, e.g., pyrrole or piperidine can be employed. The aqueous solution of alkali for use as the developing solution may contain an appropriate amount of an alcohol, a surfactant or an aromatic hydroxy group-containing compound. Particularly, tetramethylammonium hydroxide is preferably used in the developing solution.

The positive resist laminate of the present invention comprises the first resist layer on a substrate. The formation of the first resist layer is conducted by dissolving the compounds used in the first resist layer in an appropriate solvent and coating the resulting solution on a substrate by a spin coating method or a spray method. A thickness of the first resist layer is preferably from 0.1 to 2.0 μm, more preferably from 0.2 to 1.5 μm and still more preferably from 0.25 to 1.2 μm. If the first resist layer has a thickness of less than 0.1 μm, it is not preferred in view of anti-reflection or dry etching resistance. On the other hand, the thickness of more than 2.0 μm is also not preferred since an aspect ratio becomes too high and a problem may occur in that fine patterns formed tend to fall.

Then, the second resist layer is formed thereon. It is preferred to conduct heat treatment of the first layer before the formation of the second resist layer. A temperature for the heat treatment is preferably from 150 to 250° C., more preferably from 170 to 240° C., and still more preferably from 180 to 230° C. In a case wherein the temperature is lower than 150° C., intermixing with the first resist layer tends to occur when the second resist layer is coated thereon. On the other hand, in a case wherein the temperature exceeds 250° C., decomposition or degradation of the polymer used in the first resist layer is apt to occur. Therefore, both of these cases are not preferred. The heat treatment can be conducted using a device such as a hot plate or heat oven.

Suitable time for the heat treatment may vary depending on the temperature of heat treatment and, for example, when the heat treatment is conducted at 180 to 230° C., the time is set preferably in a range of from 10 seconds to 1,000 seconds, more preferably in a range of from 20 to 600 seconds. In a case wherein the time is shorter then 10 seconds, heat curing of the first resist layer is insufficient and intermixing with the second resist layer tends to occur. On the other hand, in a case wherein the time is longer than 1,000 seconds, a number of substrate to be treated decreases. Thus, both of these cases are not preferred.

The second resist layer is then provided on the first resist layer. The second resist layer may be formed simultaneously with the formation of the first resist layer. A thickness of the second layer is preferably from 0.03 to 0.6 μm, more preferably from 0.04 to 0.5 μm and still more preferably from 0.05 to 0.45 μm. In a case wherein the thickness is less than 0.03 μm, transferability of pattern to the first resist layer is poor and pinholes are apt to occur in the coated layer and on the other hand, in a case wherein the thickness is more than 0.6 μm, lithographic properties may degrade and thus, both cases are not preferred.

The two-layer resist thus-obtained is then subjected to a pattern formation process. As the first step thereof, pattern formation treatment is conducted to a resist composition film of the second resist layer. Mask alignment is carried out, if desired, and the second layer is irradiated with a high-energy ray through the mask thereby making an irradiated portion of the resist composition soluble in an aqueous alkaline solution, followed by developing with the aqueous alkaline solution to form a pattern.

Subsequently, dry etching is carried out as the second step. The process is conducted by oxygen plasma etching using the pattern of the resist composition film described above as a mask to form a fine pattern having a high aspect ratio. The etching of the organic polymer film of the second resist layer by the oxygen plasma etching is a technique quite similar to plasma etching utilized for stripping of a resist film carried out after the termination of etching process of a substrate according to a conventional photo-etching process. For example, the operation can be conducted using a reactive gas, i.e., an oxygen gas, as an etching gas in a cylindrical plasma etching apparatus. A mixture of oxygen gas and other gas such as sulfite gas may also be used.

The positive resist laminate of the present invention has high resolution and is respondent to exposure in a far ultraviolet region. Also, it can form a resist pattern in which winding of line and development defect are restrained in fine pattern of 0.2 μm or less. Further, it can accept treatment at high temperature in a short time and thus, it is excellent in production aptitude. Therefore, the positive resist laminate of the present invention can be particularly preferably employed for mass production of semiconductor boards having ultra-fine circuits.

The present invention will be described in greater detail with reference to the following examples, but the present invention should not be construed as being limited thereto.

SYNTHESIS EXAMPLE 1

Synthesis of P-2 of Component (a-1)

<Synthesis of Monomer>

In 70 ml of acetone were dissolved 10.6 g of methacrylic chloride, 15 g of 1-adamantanol and 0.5 g of methoxyhydroquinone, and to the solution was dropwise added 10.3 g of triethylamine. The mixture was reacted at 60° C. for 4 hours. To the reaction mixture was added 0.5 liters of distilled water and the precipitate was collected by decantation. The product was purified by silica gel chromatography. The yield was 85%.

<Synthesis of Polymer>

In 100 g of dimethylformamide (DMF) were dissolved 13.3 g of the monomer described above and 6.0 g of p-hydroxystyrene. The reaction solution was heated at 65° C. and at the same time nitrogen gas was streamed in the reaction solution for 30 minutes. Then, each 35 mg of a polymerization initiator (V-65 manufactured by Wako Pure Chemical Industries, Ltd.) was added three times every two hours to the reaction solution. The reaction mixture was reprecipitated in one liter of distilled water and P-2 of Component (a-1) was collected as powder. As a result of GPC analysis of the polymer thus-obtained, a weight average molecular weight thereof in terms of standard polystyrene was 12,600.

SYNTHESIS EXAMPLE 2

Synthesis of P-4 of Component (a-1)

<Synthesis of Polymer>

In 100 ml of DMF were dissolved 13.3 g of isobornyl methacrylate and 4.8 g of p-hydroxystyrene. The reaction solution was heated at 65° C. and at the same time nitrogen gas was streamed in the reaction solution for 30 minutes. Then, each 50 mg of a polymerization initiator (V-65 manufactured by Wako Pure Chemical Industries, Ltd.) was added three times every two hours to the reaction solution. The reaction mixture was reprecipitated in one liter of distilled water and P-4 of Component (a-1) was collected as powder. As a result of GPC analysis of the polymer thus-obtained, a weight average molecular weight thereof in terms of standard polystyrene was 11,500.

In the same manner as described above, P-6 to P-12 of Component (a-1) were synthesized.

SYNTHESIS EXAMPLE 3

Synthesis of Resin (9) of Component (b)

To 34 g of dried THF were added 10.4 g of trimethylallylsilane, 9.8 g of maleic anhydride and 5.3 g of tert-butyl acrylate and the mixture was heated at 65° C. under a nitrogen gas stream. After the reaction temperature was stabilized, 10% by mole of an initiator (V-65 manufactured by Wako Pure Chemical Industries, Ltd.) based on the total molar amount of the monomers described above was added to initiate a reaction. After reacting for 6 hours, the reaction mixture was diluted twice with THF and then poured into a large amount of hexane to deposit white powder. Then, in order to reduce the remaining monomer and low-molecular weight components, the deposited powder was dissolved in acetone and to the solution was gradually added hexane, thereby deposited a polymer. The polymer deposited was washed with a mixture of hexane/acetone (8/2) and dried under a reduced pressure to obtain Resin (9). As a result of GPC analysis of Polymer (9) of Component (b), a weight average molecular weight thereof in terms of standard polystyrene was 5,600 and a content of the component having a molecular weight of 1,000 or less was 4% in the space ratio of GPC.

In the same manner as described above, Resin (1) to Resin (16) of Component (b) were synthesized.

SYNTHESIS EXAMPLE 4

Synthesis of Resin (19) of Component (b)

<Synthesis of Monomer>

To 200 ml of dried THF was added 29.1 g of tris(trimethylsilyl)-2-hydroxyethylsilane and then 11.2 g of 4-dimethylaminopyridine was added thereto. The reaction solution was cooled to 0° C. and 14.0 g of acrylic chrolide was dropwise added thereto over a period of one hour. The reaction was continued for 5 hours, while a temperature of the reaction solution was returned to room temperature. The reaction solution was concentrated under a reduced pressure and treated by silica gel column chromatography to obtain the desired acrylate monomer.

<Synthesis of Polymer>

In THF were dissolved 18.0 g of the acrylate monomer described above, 9.5 g of maleic anhydride and 3.8 g of methacrylic acid so as to prepare a solution having a solid content of 50%. The solution was put into a three-necked flask and heated at 60° C. under a nitrogen gas stream. After the reaction temperature was stabilized, 5% by mole of an initiator (V-60 manufactured by Wako Pure Chemical Industries, Ltd.) based on the total molar amount of the monomers described above was added to initiate a reaction. After reacting for 6 hours, the reaction mixture was diluted twice with THF and then poured into a large amount of hexane to deposit white powder. The powder deposited was collected by filtration and dried to obtain Resin (19). As a result of GPC analysis of Polymer (19) of Component (b), a weight average molecular weight thereof in terms of standard polystyrene was 6,900.

In the same manner as described above, Resin (17) to Resin (30) of Component (b) were synthesized.

EXAMPLE 1

(1) Formation of First Resist Layer

In 28.0 g of methoxypropyl acetate were dissolved 5.0 g of P-2 of Component (a-1) obtained above, 0.35 g of hexamethylolmelamine of Component (a-2) and 0.125 g of di(tert-amyl)phenyliodonium-2,4,6-triisopropylphenylsulfonate (a-3) and the resulting solution was subjected to precision filtration using a membrane filter having a pore size of 0.1 μm to prepare a coating solution for the first resist layer.

The coating solution was coated on a 6 inch silicon wafer using a spin coater (Mark 8 manufactured by Tokyo Electron Ltd.) and baked at 90° C. for 90 seconds to form a uniform layer having a thickness of 0.55 μm. The layer was then heated at 200° C. for 90 seconds to obtain the first resist layer having a thickness of 0.40 μm.

(2) Formation of Second Resist Layer

In 9 g of methoxypropyl acetate were dissolved 0.9 g of Resin (2) of Component (b) obtained above, 0.05 g of C-4 of Component (c) shown below, 0.005 g of 1,5-diazabicyclo[4.3.0]-5-nonene as a nitrogen-containing basic compound and 0.001 g of W-1 shown below as a surfactant and the resulting solution was subjected to precision filtration using a membrane filter having a pore size of 0.1 μm to prepare a coating solution for the second resist layer.

The coating solution was coated on the first resist layer described above in the same manner as above and heated at 130° C. for 90 seconds to obtain the second resist layer having a thickness of 0.20 μm.

The wafer thus-obtained was exposed using an ArF excimer laser stepper 9300 (manufactured by ISI Co., Ltd.) equipped with a resolution mask, while changing exposure amount. The wafer was heated in a clean room at 120° C. for 90 seconds, developed with a tetrahydroammonium hydroxide developing solution (2.38%) for 60 seconds, rinsed with distilled water and dried to obtain a pattern (upper layer pattern).

The wafer having the upper layer pattern was then subjected to etching (dry development) using a parallel flat plate reactive ion etching apparatus (DES-245R manufactured by Plasma System Co., Ltd.) to form a pattern in the lower layer. The etching gas, pressure and applied power used were oxygen, 20 mTorr and 100 mW/cm², respectively. The resist pattern formed was observed by a scanning electron microscope.

The resist pattern was evaluated with respect to resolution, winding of line pattern and number of development defect in the following manner.

(1) Resolution

The resolution was evaluated using a minimum size of line/space capable of being resolved in the lower layer in an exposure amount necessary for reproducing line/space of 0.15 μm of a mask.

(2) Winding of Line Pattern

The winding of line pattern was evaluated using a mean value of deviations from a straight line of 0.15 μm measured at optional 20 points within a length of 20 μm in a line/space of 0.15 μm of a mask.

(3) Number of Development Defect

The number of development defect was measured by KLA 2112 (manufacture by KLA Tencole Co., Ltd.) using the exposed and developed sample having the line/space pattern formed according to the above-described method (Threshold: 12, Pixel size: 0.39).

The resolution, winding of line pattern and number of development defect thus obtained were 0.130 μm, 0.008 μm and 5, respectively.

EXAMPLES 2 to 30

Resist laminates were prepared using the equiamounts of Components (a-1), (a-2) and (a-3) shown in Table 1 below in place of Components (a-1), (a-2) and (a-3) used in the first resist layer of EXAMPLE 1, and the equimolar amounts of Components (b) and (c) shown in Table 1 below in place of Components (b) and (c) used in the second resist layer of EXAMPLE 1, respectively. The nitrogen-containing basic compound and surfactant shown in Table 1 below were also used. The exposure, development and etching were conducted in the same manner as in Example 1 and the resolution, winding of line pattern and number of development defect were evaluated in the same manner as in Example 1. The results obtained are shown in Table 2 below.

Components (a-2), Components (a-3), Components (c), nitrogen-containing basic compounds and surfactants used are shown below.

Component (a-2) (a2-1): Hexamethylolmelamine
Component (a-2) (a2-2): Hexamethylolurea
Component (a-3) (a3-1): Di(tert-amyl)phenyliodonium-2,4,6-triisopropylphenylsulfonate
Component (a-3) (a3-2): Di(tert-amyl)phenyliodonium-pentafluorophenylsulfonate
Component (a-3) (a3-3): Cyclohexyl-p-toluenesulfonate
Component (c) (C-1): Triphenylsulfonium-trifluoromethanesulfonate
Component (c) (C-2): Tri(tert-butylphenyl)sulfonium-perfluorobutanesulfonate
Component (c) (C-3): Diphenyl-2,4,6-trimethylphenylsulfonium-perfluorooctanesulfonate
Component (c) (C-4): Triphenylsulfonium-2,4,6-triisopropylphenylsulfonate
Nitrogen-containing basic compound (D-1): 1,5-Diazabicyclo[4.3.0]-5-nonene
Nitrogen-containing basic compound (D-2): 1,8-Diazabicyclo[5.4.0]-7-undecene
Nitrogen-containing basic compound (D-3): 2-Phenybenzimidazole
Surfactant (W-1): Megafac F176 (manufactured by Dainippon Ink and Chemicals, Inc.)
Surfactant (W-2): Megafac R08 (manufactured by Dainippon Ink and Chemicals, Inc.)
Surfactant (W-3): Polysiloxane Polymer KP-341 (manufactured by Shin-Etsu Chemical Co., Ltd.)

COMPARATIVE EXAMPLES 1 to 3

Resist laminates were prepared in the same manner as in Example 1 except for using a resist for i-line (FHi-028D manufacture by Fuji Film Arch Co., Ltd.) in place of the first resist layer in Example 1 and changing the conditions for the heat treatment to 200° C. for 90 seconds (Comparative Example 1), 200° C. for 10 minutes (Comparative Example 2) and 200° C. for 60 minutes (Comparative Example 3), respectively. The exposure, development and etching were conducted in the same manner as in Example 1 and the resolution, winding of line pattern and number of development defect were evaluated in the same manner as in Example 1. The results obtained are also shown in Table 2 below.

TABLE 1

| | First Resist Layer | | | Second Resist Layer | | | |
|---|---|---|---|---|---|---|---|
| Example | Component (a-1) | Component (a-2) | Component (a-3) | Component (b) | Component (c) | D | W |
| 1 | P-2 | a2-1 | a3-1 | Resin (2) | C-4 | D-1 | W-1 |
| 2 | P-2 | a2-1 | a3-1 | Resin (2) | C-3 | D-2 | W-1 |
| 3 | P-2 | a2-1 | a3-2 | Resin (2) | C-4 | D-3 | W-1 |
| 4 | P-2 | a2-1 | a3-2 | Resin (2) | C-1 | — | W-1 |
| 5 | P-4 | a2-1 | a3-1 | Resin (2) | C-3 | D-1 | — |
| 6 | P-4 | a2-1 | a3-1 | Resin (2) | C-2 | D-1 | W-2 |
| 7 | P-4 | a2-2 | a3-1 | Resin (9) | C-1 | D-1 | W-2 |
| 8 | P-4 | a2-2 | a3-1 | Resin (9) | C-2 | D-2 | W-2 |
| 9 | P-6 | a2-2 | a3-1 | Resin (9) | C-3 | D-2 | W-2 |
| 10 | P-6 | a2-1 | a3-3 | Resin (10) | C-4 | D-2 | W-3 |
| 11 | P-6 | a2-1 | a3-3 | Resin (10) | C-1 | — | W-3 |

TABLE 1-continued

|  | First Resist Layer | | | Second Resist Layer | | | |
|---|---|---|---|---|---|---|---|
| Example | Component (a-1) | Component (a-2) | Component (a-3) | Component (b) | Component (c) | D | W |
| 12 | P-6 | a2-1 | a3-3 | Resin (10) | C-2 | — | W-3 |
| 13 | P-6 | a2-1 | a3-3 | Resin (18) | C-4 | D-3 | W-3 |
| 14 | P-6 | a2-1 | a3-3 | Resin (18) | C-1 | D-3 | W-3 |
| 15 | P-6 | a2-1 | a3-3 | Resin (18) | C-2 | D-3 | W-3 |
| 16 | P-7 | a2-1 | a3-3 | Resin (19) | C-1 | D-3 | W-3 |
| 17 | P-7 | a2-1 | a3-3 | Resin (21) | C-1 | D-1 | W-3 |
| 18 | P-9 | a2-1 | a3-3 | Resin (21) | C-3 | D-1 | W-1 |
| 19 | P-10 | a2-1 | a3-1 | Resin (21) | C-3 | D-2 | W-1 |
| 20 | P-10 | a2-1 | a3-1 | Resin (23) | C-1 | D-1 | W-1 |
| 21 | P-10 | a2-1 | a3-1 | Resin (23) | C-4 | D-1 | — |
| 22 | P-10 | a2-1 | a3-1 | Resin (23) | C-4 | D-2 | W-1 |
| 23 | P-10 | a2-1 | a3-1 | Resin (23) | C-3 | D-1 | W-1 |
| 24 | P-10 | a2-1 | a3-1 | Resin (24) | C-3 | D-2 | W-1 |
| 25 | P-10 | a2-1 | a3-1 | Resin (24) | C-3 | D-3 | W-2 |
| 26 | P-10 | a2-1 | a3-1 | Resin (24) | C-3 | D-1 | W-2 |
| 27 | P-11 | a2-1 | a3-1 | Resin (26) | C-3 | D-1 | W-2 |
| 28 | P-11 | a2-1 | a3-1 | Resin (26) | C-3 | D-1 | W-1 |
| 29 | P-11 | a2-1 | a3-1 | Resin (26) | C-3 | D-2 | W-3 |
| 30 | P-12 | a2-1 | a3-1 | Resin (26) | C-3 | D-3 | W-1 |

D: Nitrogen-containing basic compound
W: Surfactant

TABLE 2

| Example | Resolution ($\mu$m) | Winding of Line Pattern ($\mu$m) | Number of Development Defect |
|---|---|---|---|
| 1 | 0.130 | 0.008 | 5 |
| 2 | 0.125 | 0.009 | 3 |
| 3 | 0.130 | 0.010 | 1 |
| 4 | 0.140 | 0.005 | 8 |
| 5 | 0.130 | 0.005 | 23 |
| 6 | 0.135 | 0.005 | 0 |
| 7 | 0.130 | 0.007 | 3 |
| 8 | 0.130 | 0.009 | 7 |
| 9 | 0.130 | 0.006 | 7 |
| 10 | 0.125 | 0.009 | 2 |
| 11 | 0.140 | 0.005 | 6 |
| 12 | 0.140 | 0.004 | 11 |
| 13 | 0.130 | 0.006 | 8 |
| 14 | 0.130 | 0.007 | 13 |
| 15 | 0.135 | 0.006 | 2 |
| 16 | 0.130 | 0.006 | 7 |
| 17 | 0.125 | 0.008 | 8 |
| 18 | 0.130 | 0.008 | 4 |
| 19 | 0.130 | 0.008 | 10 |
| 20 | 0.130 | 0.009 | 2 |
| 21 | 0.130 | 0.010 | 28 |
| 22 | 0.125 | 0.004 | 0 |
| 23 | 0.130 | 0.006 | 6 |
| 24 | 0.135 | 0.005 | 5 |
| 25 | 0.135 | 0.005 | 8 |
| 26 | 0.125 | 0.006 | 1 |
| 27 | 0.130 | 0.008 | 10 |
| 28 | 0.130 | 0.005 | 8 |
| 29 | 0.130 | 0.006 | 5 |
| 30 | 0.135 | 0.007 | 5 |
| Comparative Example 1 | 0.155 | 0.06 | 352 |
| Comparative Example 2 | 0.150 | 0.04 | 218 |
| Comparative Example 3 | 0.140 | 0.02 | 270 |

As is apparent from the results shown in Table 2, the positive resist laminates according to the examples of the present invention exhibit the excellent resolution, little winding of line pattern and small number of development defect.

On the contrary, it can be seen that in the comparative examples wherein polymer (a-1) is not used in the first resist layer, these characteristics are inferior and particularly, the large winging of line pattern and large number of development defect are observed.

While the present invention has been described in detail and with reference to specific embodiments thereof, it will be apparent to one skilled in the art that various changes and modifications can be made therein without departing from the spirit and scope thereof.

What is claimed is:

1. A positive resist laminate which comprises a substrate, a first resist layer and a second resist layer, in this order,
   wherein the first resist layer is capable of being hardened with heat and comprises (a-1) a polymer containing a repeating unit represented by formula (1) shown below and a repeating unit represented by formula (2) shown below, and
   the second resist layer comprises: (b) a polymer which contains a silicon atom in the side chain thereof and which is insoluble in water and becomes soluble in an aqueous alkali solution by the action of an acid; (c) a compound which generates an acid upon irradiation with an actinic ray or radiation; and (e) a surfactant containing at least one of a fluorine atom and a silicon atom:

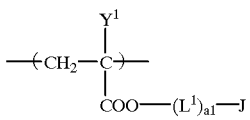

(1)

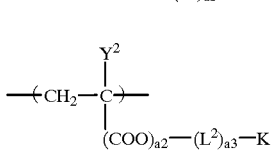

(2)

wherein $Y^1$ and $Y^2$ each independently represents a hydrogen atom, an alkyl group, a cyano group or a halogen atom;

L¹ and L² each independently represents a divalent linkage group; J represents an alicyclic hydrocarbon group which may be substituted; a1 represents 0 or 1; K represents an aryl group which may be substituted; and a2 and a3, which are the same or different, each represents 0 or 1,
wherein the polymer (b) is at least one of:
  a polymer (b-3) containing a repeating unit represented by formula (7) shown below; and
  a polymer (b-4) containing: a repeating unit represented by formula (7) shown below; and at least one repeating unit selected from those represented by formulae (5a) and (5b):

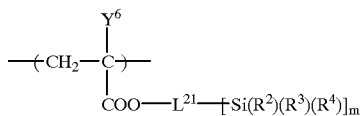

(7)

wherein $Y^6$ represents a hydrogen atom, an alkyl group, a cyano group or a halogen atom; $R^2$, $R^3$ and $R^4$, which are the same or different, each represents an alkyl group, a haloalkyl group, a halogen atom, an alkoxy group, a trialkylsilyl group or trialkylsilyloxy group; $L^{21}$ represents a linkage group having a valence of from 2 to 4; and m represents an integer of from 1 to 3,

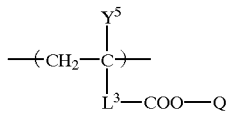

(5a)

wherein $Y^5$ represents a hydrogen atom, an alkyl group, a cyano group or a halogen atom; $L^3$ represents a single bond or a divalent linkage group; and Q represents a group which is decomposable by an acid to generate a carboxylic acid, and

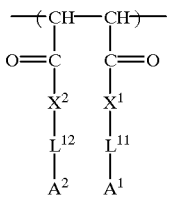

(5b)

wherein $X^1$ and $X^2$, which are the same or different, each represents an oxygen atom, a sulfur atom, —NH— or —NHSO₂—; $L^{11}$ and $L^{12}$, which are the same or different, each represents a single bond or a divalent linkage group; $A^1$ and $A^2$, which are the same or different, each represents a hydrogen atom, a cyano group, a hydroxy group, —COOH, —COOR⁵, —CO—NH—R⁶, an alkyl group which may be substituted, an alkoxy group which may be substituted or —COOQ; $R^5$ and $R^6$, which are the same or different, each represents an alkyl group which may be substituted; and Q represents a group which is decomposable by an acid to generate a carboxylic acid.

2. The positive resist laminate as claimed in claim 1, wherein the polymer (a-1) contains at least one group selected from a hydroxy group, a primary amino group and a secondary amino group, and the first resist layer further comprises: (a-2) a crosslinking agent which is activated by an acid to react with the polymer (a-1), thereby forming a crosslinking structure; and (a-3) a compound which generate an acid by heat.

3. The positive resist laminate as claimed in claim 2, wherein the crosslinking agent (a-2) is a compound selected from a melamine compound, benzoguanamine compound, glycoluril compound and urea compound each substituted with at least one group selected from a methylol group, an alkoxymethyl group and an acyloxymethyl group.

4. The positive resist laminate as claimed in claim 2, wherein the compound (a-3) is a sulfonic acid ester compound.

5. The positive resist laminate as claimed in claim 2, wherein the compound (a-3) is a diaryliodonium salt compound.

6. The positive resist laminate as claimed in claim 1, wherein the second resist layer further comprises (d) a nitrogen-containing basic compound.

7. The positive resist laminate as claimed in claim 6, wherein the nitrogen-containing basic compound (d) is a nitrogen-containing cyclic compound having the structure represented by the following formula (VI):

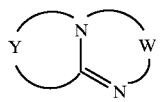

(VI)

wherein Y and W, which are the same or different, each represents a straight-chain, branched or cyclic alkylene group which may contain a hetero atom or may be substituted.

8. The positive resist laminate as claimed in claim 1, wherein the alicyclic hydrocarbon group represented by J in the formula (I) is a bridged alicyclic hydrocarbon group having from 5 to 25 carbon atoms.

9. The positive resist laminate as claimed in claim 1, wherein the compound (c) is an iodonium salt represented by formula (PAG3) shown below or a sulfonium salt represented by formula (PAG4) shown below:

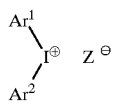

(PAG3)

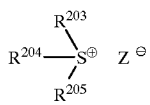

(PAG4)

wherein $Ar^1$ and $Ar^2$, which are the same or different, each represents a substituted or unsubstituted aryl group; $R^{203}$, $R^{204}$ and $R^{205}$, which are the same or different, each represents a substituted or unsubstituted alkyl group or a substituted or unsubstituted aryl group; and $Z^-$ represents a counter anion.

10. The positive resist laminate as claimed in claim 1, wherein the first resist layer has a thickness of from 0.1 to 2.0 μm.

11. The positive resist laminate as claimed in claim 1, wherein the second resist layer has a thickness of from 0.03 to 0.6 μm.

12. The positive resist laminate as claimed in claim 1, wherein the polymer (a-1) contains the repeating unit represented by formula (1) in a content of from 10 to 90% by mole.

13. The positive resist laminate as claimed in claim 1, wherein the polymer (a-1) contains the repeating unit represented by formula (2) in a content of from 10 to 90% by mole.

14. The positive resist laminate as claimed in claim 1, wherein the first resist layer contains the polymer (a-1) in a content of 70 to 98% by weight based on the solid content.

15. The positive resist laminate as claimed in claim 1, wherein the second resist layer contains the polymer (b) in a content of 40 to 99% by weight based on the solid content.

16. The positive resist laminate as claimed in claim 1, which comprises the substrate, the first resist layer provided on the substrate and the second resist layer provided on the first resist layer.

* * * * *